(12) United States Patent
Wu et al.

(10) Patent No.: US 12,080,592 B2
(45) Date of Patent: Sep. 3, 2024

(54) FILM STACK SIMPLIFICATION FOR HIGH ASPECT RATIO PATTERNING AND VERTICAL SCALING

(71) Applicant: Lam Research Corporation, Fremont, CA (US)

(72) Inventors: Hui-Jung Wu, Pleasanton, CA (US); Bart J. van Schravendijk, Palo Alto, CA (US); Mark Naoshi Kawaguchi, San Carlos, CA (US); Gereng Gunawan, Saratoga, CA (US); Jay E. Uglow, Livermore, CA (US); Nagraj Shankar, Tualatin, OR (US); Gowri Channa Kamarthy, Pleasanton, CA (US); Kevin M. McLaughlin, Sherwood, OR (US); Ananda K. Banerji, West Linn, OR (US); Jialing Yang, Sherwood, OR (US); John Hoang, Fremont, CA (US); Aaron Lynn Routzahn, Fremont, CA (US); Nathan Musselwhite, San Jose, CA (US); Meihua Shen, Fremont, CA (US); Thorsten Bernd Lill, Kalaheo, HI (US); Hao Chi, San Mateo, CA (US); Nicholas Dominic Altieri, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 334 days.

(21) Appl. No.: 17/250,835

(22) PCT Filed: Sep. 10, 2019

(86) PCT No.: PCT/US2019/050369
§ 371 (c)(1),
(2) Date: Mar. 10, 2021

(87) PCT Pub. No.: WO2020/055837
PCT Pub. Date: Mar. 19, 2020

(65) Prior Publication Data
US 2022/0051938 A1 Feb. 17, 2022

Related U.S. Application Data

(60) Provisional application No. 62/729,323, filed on Sep. 10, 2018.

(51) Int. Cl.
*H01L 21/336* (2006.01)
*H01L 21/02* (2006.01)
(Continued)

(52) U.S. Cl.
CPC .... *H01L 21/76846* (2013.01); *H01L 21/0217* (2013.01); *H01L 21/02263* (2013.01);
(Continued)

(58) Field of Classification Search
CPC ................. H01L 21/02; H01L 21/0217; H01L 21/02263; H01L 21/311; H01L 21/31105;
(Continued)

(56) References Cited

U.S. PATENT DOCUMENTS 8,728,956 B2 5/2014 LaVoie et al.
8,741,394 B2 6/2014 Haverkamp et al.
(Continued)

FOREIGN PATENT DOCUMENTS

JP H09232573 A 9/1997
JP 2006511963 A 4/2006
(Continued)

OTHER PUBLICATIONS

Chien et al., "A Design for Selective Wet Etching of $Si_3N_4/SiO_2$ in Phosphoric Acid Using a Single Wafer Processor," Journal of The Electrochemical Society, vol. 165 (4), 2018, pp. H3187-H3191, 5 pages.
(Continued)

*Primary Examiner* — Ismail A Muse
(74) *Attorney, Agent, or Firm* — Weaver Austin Villeneuve & Sampson LLP

(57) ABSTRACT

Methods for forming patterned multi-layer stacks including a metal-containing layer are provided herein. Methods involve using silicon-containing non-metal materials in a multi-layer stack including one sacrificial layer to be later
(Continued)

removed and replaced with metal while maintaining etch contrast to pattern the multi-layer stack and selectively remove the sacrificial layer prior to depositing metal. Methods involve using silicon oxycarbide in lieu of silicon nitride, and a sacrificial non-metal material in lieu of a metal-containing layer, to fabricate the multi-layer stack, pattern the multi-layer stack, selectively remove the sacrificial non-metal material to leave spaces in the stack, and deposit metal-containing material into the spaces. Sacrificial non-metal materials include silicon nitride and doped polysilicon, such as boron-doped silicon.

8 Claims, 15 Drawing Sheets

(51) Int. Cl.
| H01L 21/311 | (2006.01) |
| H01L 21/768 | (2006.01) |
| H01L 29/788 | (2006.01) |
| H10B 41/20 | (2023.01) |
| H10B 41/35 | (2023.01) |

(52) U.S. Cl.
CPC .. *H01L 21/31105* (2013.01); *H01L 21/76816* (2013.01); *H01L 29/7889* (2013.01); *H10B 41/20* (2023.02); *H10B 41/35* (2023.02)

(58) Field of Classification Search
CPC ............. H01L 21/768; H01L 21/76816; H01L 21/76846; H01L 27/11524; H01L 27/11551; H01L 29/788; H01L 29/7889; H01L 2224/1354; H01L 2224/2954; H01L 2224/3754; H01L 2224/4554; H01L 29/78642; H01L 29/7926; H10B 41/20; H10B 41/27; H10B 41/35; H10B 41/50; H10B 43/27; H10B 43/50
USPC ......................................................... 257/750
See application file for complete search history.

(56) References Cited

U.S. PATENT DOCUMENTS

| 9,028,924 | B2 | 5/2015 | Haverkamp et al. |
| 9,892,800 | B2 | 2/2018 | Harari |
| 2011/0236594 | A1 | 9/2011 | Haverkamp et al. |
| 2011/0256734 | A1 | 10/2011 | Hausmann et al. |
| 2014/0008714 | A1* | 1/2014 | Makala ................. H10B 41/20 257/E27.06 |
| 2014/0167131 | A1 | 6/2014 | Lu et al. |
| 2015/0035035 | A1 | 2/2015 | Matsuda |
| 2015/0064902 | A1* | 3/2015 | Park ..................... H01L 21/311 438/666 |
| 2016/0079252 | A1* | 3/2016 | Yamashita ........ H01L 29/42324 438/588 |
| 2016/0163729 | A1 | 6/2016 | Zhang et al. |
| 2016/0187299 | A1* | 6/2016 | Wang ................... B81B 3/0086 310/334 |
| 2016/0268191 | A1 | 9/2016 | Hu et al. |
| 2016/0322377 | A1 | 11/2016 | Ide |
| 2017/0062456 | A1* | 3/2017 | Sugino .................. H10B 43/35 |
| 2017/0084449 | A1* | 3/2017 | Dube ............... H01L 21/02172 |
| 2017/0084623 | A1 | 3/2017 | Sharangpani et al. |
| 2017/0154894 | A1 | 6/2017 | Yoshimizu et al. |
| 2017/0338243 | A1 | 11/2017 | Sohn et al. |
| 2018/0090219 | A1 | 3/2018 | Harari |
| 2018/0144977 | A1* | 5/2018 | Yu ..................... H01L 21/02211 |
| 2018/0330985 | A1* | 11/2018 | Yu ..................... H01L 21/02216 |
| 2019/0157296 | A1 | 5/2019 | Harari et al. |
| 2021/0125861 | A1* | 4/2021 | Hopkins ............... H10B 43/50 |
| 2021/0335803 | A1* | 10/2021 | Tiwari ................ H10B 41/50 |

FOREIGN PATENT DOCUMENTS

| JP | 2011108921 A | 6/2011 |
| JP | 2012094694 A | 5/2012 |
| JP | 2014011389 A | 1/2014 |
| JP | 2015028988 A | 2/2015 |
| JP | 2017103328 A | 6/2017 |
| JP | 2017147337 A | 8/2017 |
| JP | 2020064924 A | 4/2020 |
| KR | 20120105209 A | 9/2012 |
| KR | 20170026102 A | 3/2017 |
| KR | 10-2017-0130797 | 11/2017 |
| WO | WO-2004061932 A1 | 7/2004 |
| WO | WO 2020/055837 | 3/2020 |

OTHER PUBLICATIONS

Petti, "3D Memory: Etch is the new Litho," Proceedings of SPIE, vol. 10589, 2018, Article No. 1058904, 9 pages.
Seidel et al., "Anisotropic Etching of Crystalline Silicon in Alkaline Solutions: II . Influence of Dopants," Journal of The Electrochemical Society, vol. 137, 1990, pp. 3626-3632.
PCT International Search Report and Written Opinion dated Jan. 3, 2020, issued in Application No. PCT/US2019/050369.
International Preliminary Report on Patentability dated Mar. 25, 2021 from PCT/US2019/050369.
TW Office Action dated Apr. 14, 2023 in Application No. TW20190132434 with English translation.
JP Office Action dated Sep. 12, 2023 in Application No. JP2021-513311 with English Translation.
JP Office Action dated Mar. 5, 2024 in JP Application No. 2021-513311, with English Translation.
KR Office Action dated Dec. 14, 2023 in KR Application No. 10-2021-7010659, with English Translation.
TW Office Action dated Dec. 15, 2023 in TW Application No. 108132434 with English Translation.
CN Office Action dated Mar. 6, 2024 in CN Application No. 201980073253.2, with English Translation.

* cited by examiner

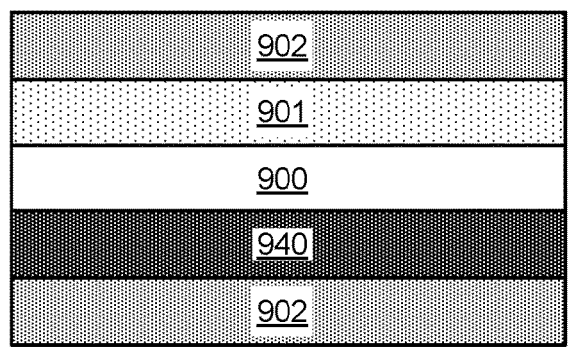
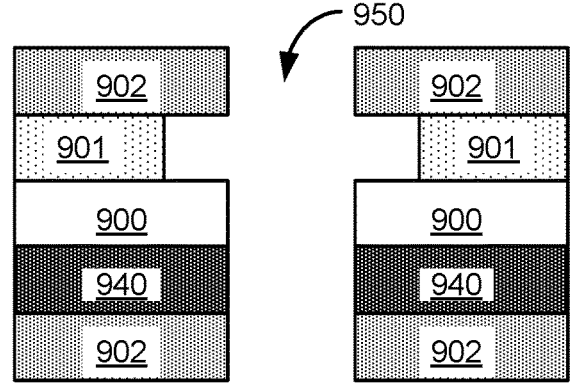
FIG. 9A
FIG. 9B
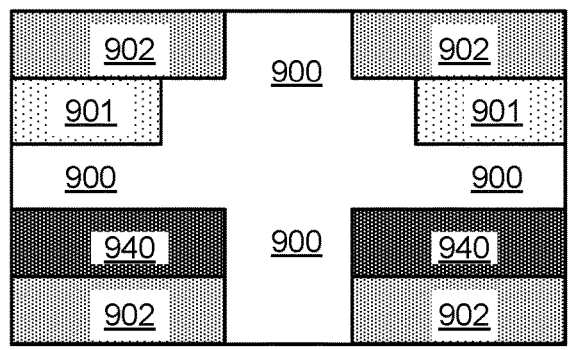
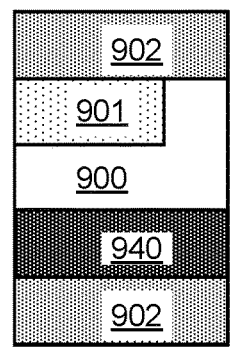
FIG. 9C
FIG. 9D

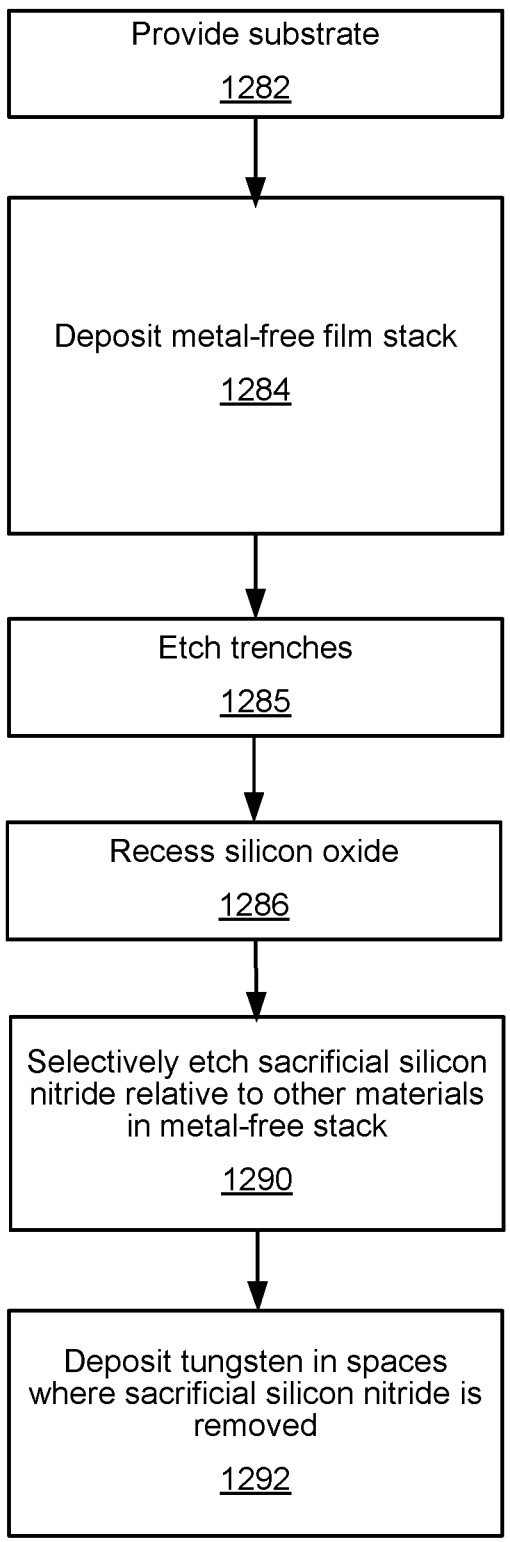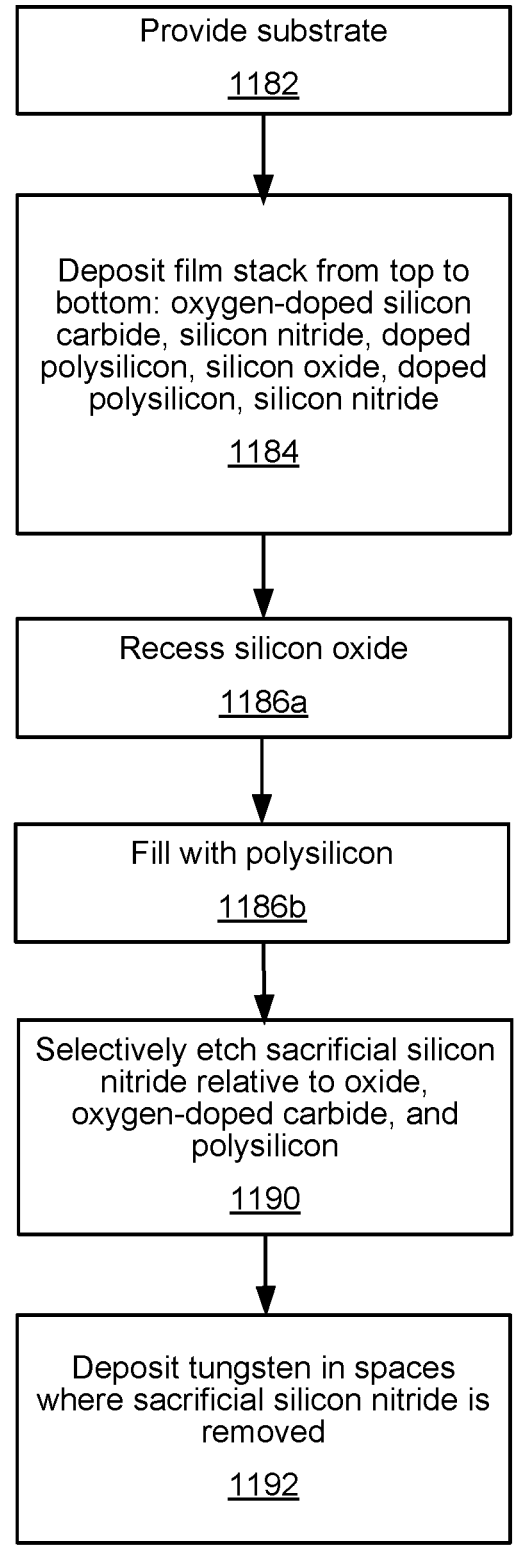
FIG. 11A
FIG. 11B

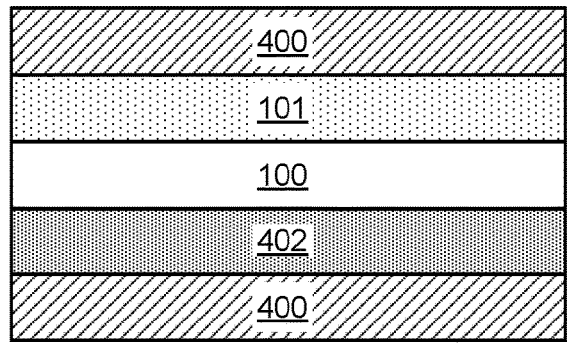
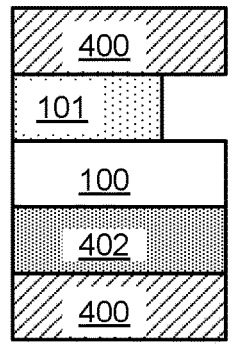
FIG. 12A  FIG. 12B
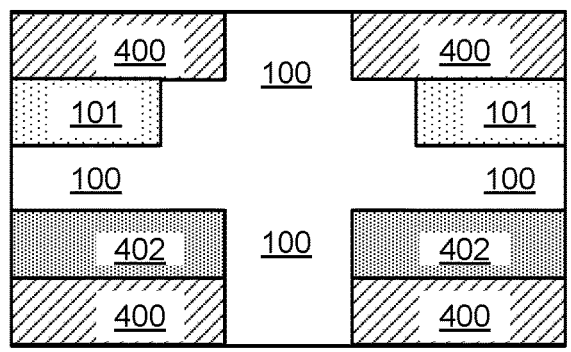
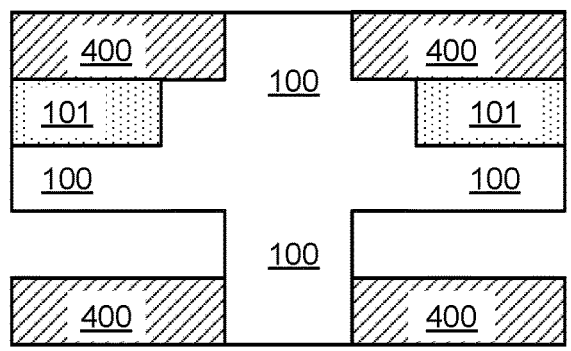
FIG. 12C  FIG. 12D
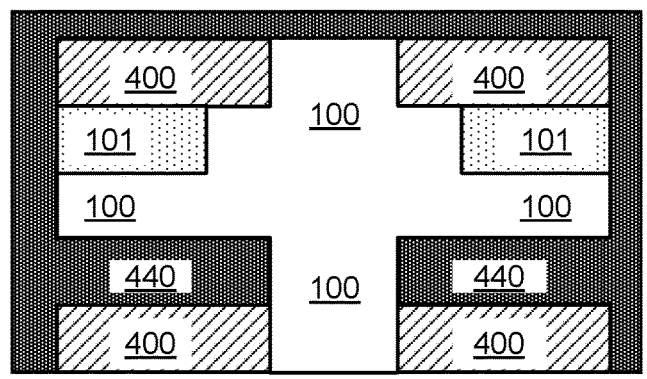
FIG. 12E

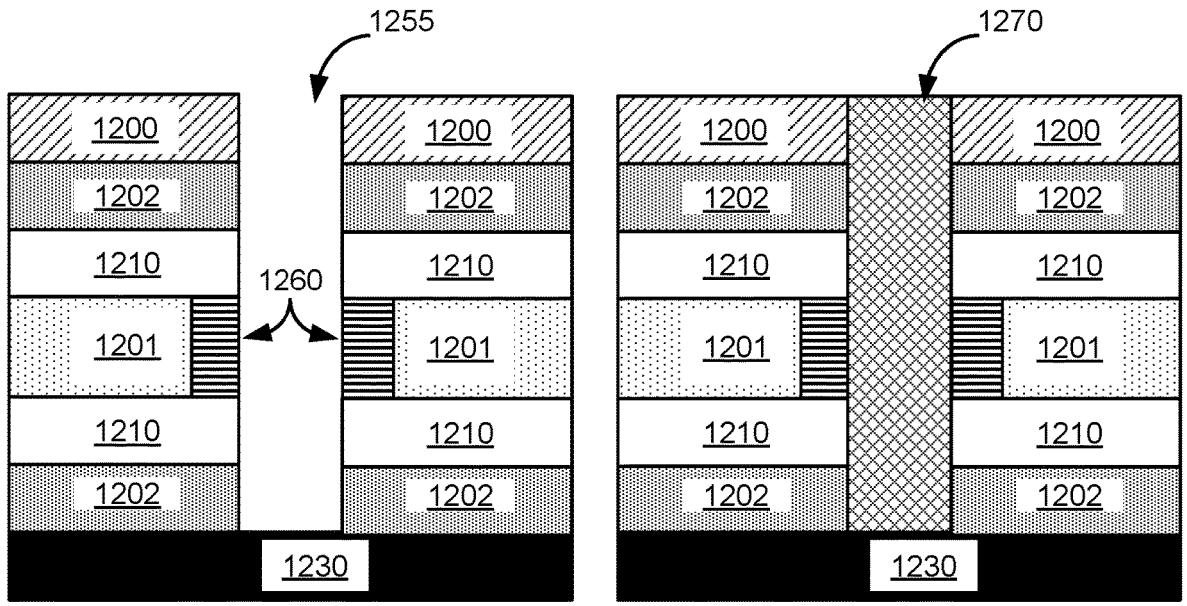
FIG. 12J  FIG. 12K
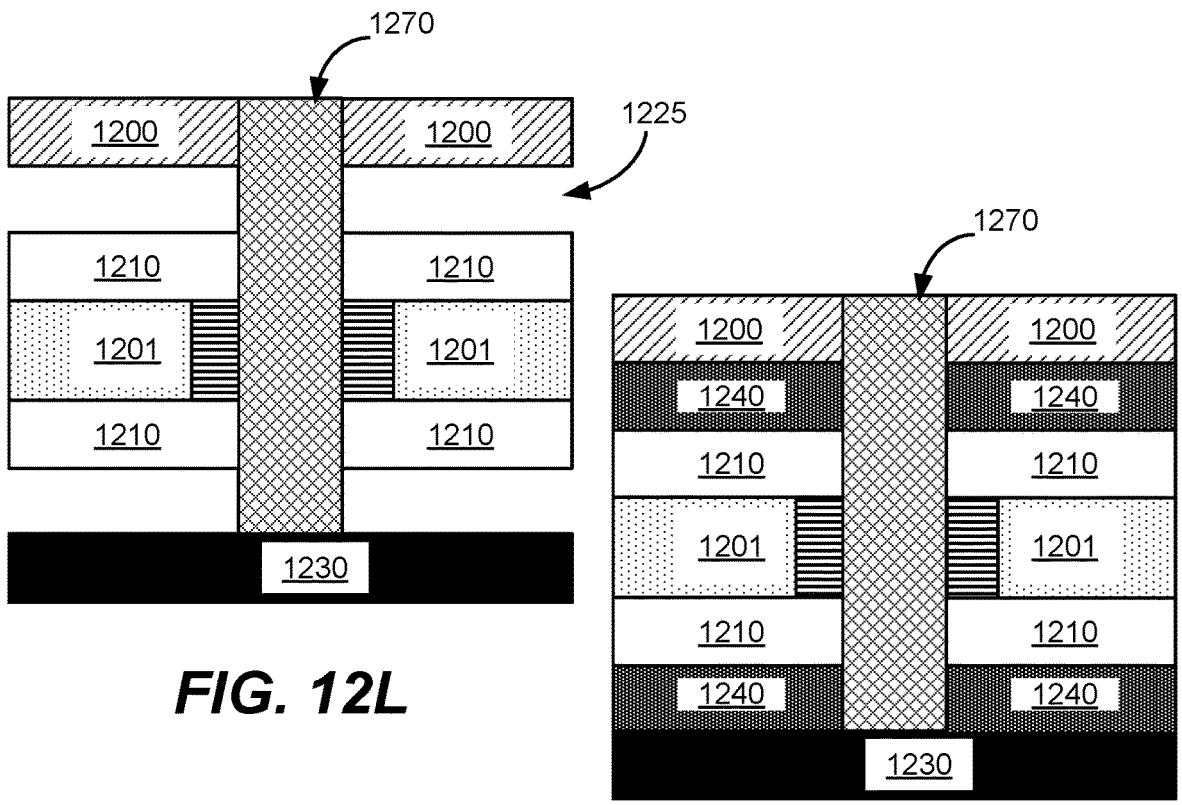
FIG. 12L
FIG. 12M

FILM STACK SIMPLIFICATION FOR HIGH ASPECT RATIO PATTERNING AND VERTICAL SCALING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Semiconductor device fabrication involves fabrication of various devices, such as flash memory. As devices shrink, structures for fabricating complex, efficient, and multiple memory cells are used to maximize density of memory cells in a memory device. 3D NAND technology addresses challenges associated with two-dimensional NAND technology by stacking memory cells vertically in layers. Additionally, fabrication may involve increasingly complex multi-layer stacks that include a combination of conducting and dielectric materials.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for fabricating semiconductor devices. One aspect involves a method including providing a semiconductor substrate; depositing a metal-free multi-layer stack having at least three different materials, at least one of the three different materials being a sacrificial layer; etching a trench or via in the metal-free multi-layer stack having the at least three different materials; after etching the trench or via, selectively etching the sacrificial layer relative to other materials of the metal-free multi-layer stack to form at least one space between layers of the metal-free multi-layer stack; and depositing metal in the at least one space to form a metal-containing multi-layer stack having a trench or via etched therein.

In various embodiments, the metal-free multi-layer stack includes three different materials.

In various embodiments, the metal-free multi-layer stack includes four different materials.

The method may also include after etching the trench or via and prior to selectively etching the sacrificial layer, recessing a dielectric material in sidewalls of the trench or via in the metal-free multi-layer stack.

In various embodiments, the sacrificial layer is polysilicon or silicon nitride.

In various embodiments, the at least three different materials include one or more of silicon oxide, undoped polysilicon, doped polysilicon, silicon nitride, oxygen-doped silicon carbide, and nitrogen-doped silicon carbide.

In various embodiments, the metal is tungsten or molybdenum.

The method may also include depositing a metal-containing liner in the at least one space prior to depositing the metal, whereby the metal is deposited on the metal-containing liner in the at least one space. In some embodiments, the metal-containing liner is selected from the group consisting of titanium nitride, aluminum oxide, and tungsten carbonitride.

In various embodiments, the metal-free multi-layer stack includes alternating layers of silicon oxycarbide, nitrogen-doped silicon carbide, and silicon oxide.

In various embodiments, the metal-free multi-layer stack includes sacrificial dielectric and alternating layers of silicon oxycarbide and silicon oxide.

In various embodiments, the at least three different materials include silicon nitride, silicon oxide, nitrogen-doped silicon carbide, and oxygen-doped silicon carbide.

In various embodiments, the at least three different materials include polysilicon, silicon oxide, nitrogen-doped silicon carbide, and oxygen-doped silicon carbide.

In various embodiments, the at least three different materials include polysilicon, silicon nitride, silicon oxide, and oxygen-doped silicon carbide.

In some embodiments, the sacrificial layer is silicon nitride. In some embodiments, the sacrificial layer may be polysilicon, or doped polysilicon.

In various embodiments, layers of the metal-free multi-layer stack are deposited by atomic layer deposition.

In some embodiments, layers of the metal-free multi-layer stack are deposited in different chambers of a single tool.

In various embodiments, layers of the metal-free multi-layer stack are deposited without breaking vacuum.

In some embodiments, layers of the metal-free multi-layer stack are deposited in four different tools.

In various embodiments, at least two layers of the metal-free multi-layer stack are deposited in a first tool and at least two other layers of the metal-free multi-layer stack are deposited in a second tool.

In some embodiments, layers of the metal-free multi-layer stack are deposited by chemical vapor deposition.

In various embodiments, layers of the metal-free multi-layer stack are deposited by plasma-enhanced chemical vapor deposition.

In some embodiments, layers of the metal-free multi-layer stack are deposited by physical vapor deposition.

In various embodiments, the method also includes recessing one of the at least three different materials after etching the trench or via to form a recessed region of the via; depositing a dielectric or semiconductor material into the trench or via; etching back the dielectric or semiconductor material in the trench or via to form smooth sidewalls, leaving the dielectric or semiconductor material in the recessed region; and prior to selectively etching the sacrificial silicon nitride, depositing a gate material into the trench or via.

Another aspect involves a method including providing a semiconductor substrate; depositing a multi-layer stack of alternating sacrificial silicon nitride and non-oxide layers; etching a trench or via in the multi-layer stack of alternating sacrificial silicon nitride and non-oxide layers; after etching the trench, selectively etching the sacrificial silicon nitride to form spaces between the non-oxide layers; and depositing metal in the spaces to form a substrate including the trench etched in alternating metal and non-oxide layers and at least one dielectric barrier layer.

In various embodiments, the at least one dielectric barrier layer includes oxygen-doped silicon carbide. For example, the concentration of oxygen in the oxygen-doped silicon carbide may be between about 1% and about 65% atomic.

In various embodiments, the non-oxide layers includes one or more of silicon oxycarbide, polysilicon, and a second silicon nitride having wet etch contrast to the sacrificial silicon nitride.

In some embodiments, the polysilicon is doped. For example, the polysilicon may be doped with a dopant selected from the group consisting of boron, phosphorous, and arsenic.

In various embodiments, the metal includes tungsten.

In various embodiments, the metal includes molybdenum.

In various embodiments, the sacrificial silicon nitride has a wet etch contrast relative to non-oxide layers and the at least one dielectric barrier layer of at least about 10:1 in 100:1 dilute hydrofluoric acid or phosphoric acid.

In various embodiments, the method also includes recessing a layer of the multi-layer stack after etching the trench or via to form a recessed region of the via; after recessing the layer, depositing a dielectric or semiconductor material into the trench or via; etching back the dielectric or semiconductor material in the trench or via to form smooth sidewalls, leaving the dielectric or semiconductor material in the recessed region; and prior to selectively etching the sacrificial silicon nitride, depositing a gate material into the trench or via These and other aspects are described further below with reference to the drawings.

BRIEF DESCRIPTION OF THE DRAWINGS

FIGS. 9A-9D show schematic illustrations of example cross-sections of a multi-layer stack during various operations of processing.

FIG. 11A is a process flow diagram of operations performed in accordance with certain disclosed embodiments.

FIG. 11B is a process flow diagram of example operations performed in accordance with certain disclosed embodiments.

FIGS. 12A-12M show schematic illustrations of example cross-sections of a multi-layer stack during various operations performed in accordance with certain disclosed embodiments

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device processing involves formation of multi-layer stacks which may be used for fabrication of various three dimensional devices such as 3D NAND structures. Some stacks include multiple alternating layers of dielectric and conducting material, each layer of which may be about 10 nm or thicker. One approach to forming such stacks involves deposition of multiple alternating layers of oxide and nitride material (ONON multiple layer deposition), followed by selective removal of nitride material and backfill deposition of metal into spaces where the nitride material previously occupied. This method may be used to fabricate 3D NAND structures.

Another approach is to directly pattern a stack of multiple, alternating layers of oxide and polysilicon (or "poly" as used elsewhere herein) where polysilicon remains as the conducting layer. In some cases, the stack may include a metal, such as tungsten material. However, formation of a stack that includes dielectric, polysilicon, and metal can be challenging using some techniques. In particular, it may be difficult to etch a trench and recess a sidewall of oxide material for forming, for example, a floating gate. Etching with a metal in the stack itself may also result in a high risk of metal residue on the resulting device and may also undesirably change the profile of the etched pattern. In some cases, fabrication of a 3-terminal device includes multiple different materials but cannot be fabricated with existing techniques. In some cases, fabrication of a 2-terminal capacitor in a 3D NAND structure faces challenges because individual source/drain regions are to be fabricated on each device.

Figure 1:
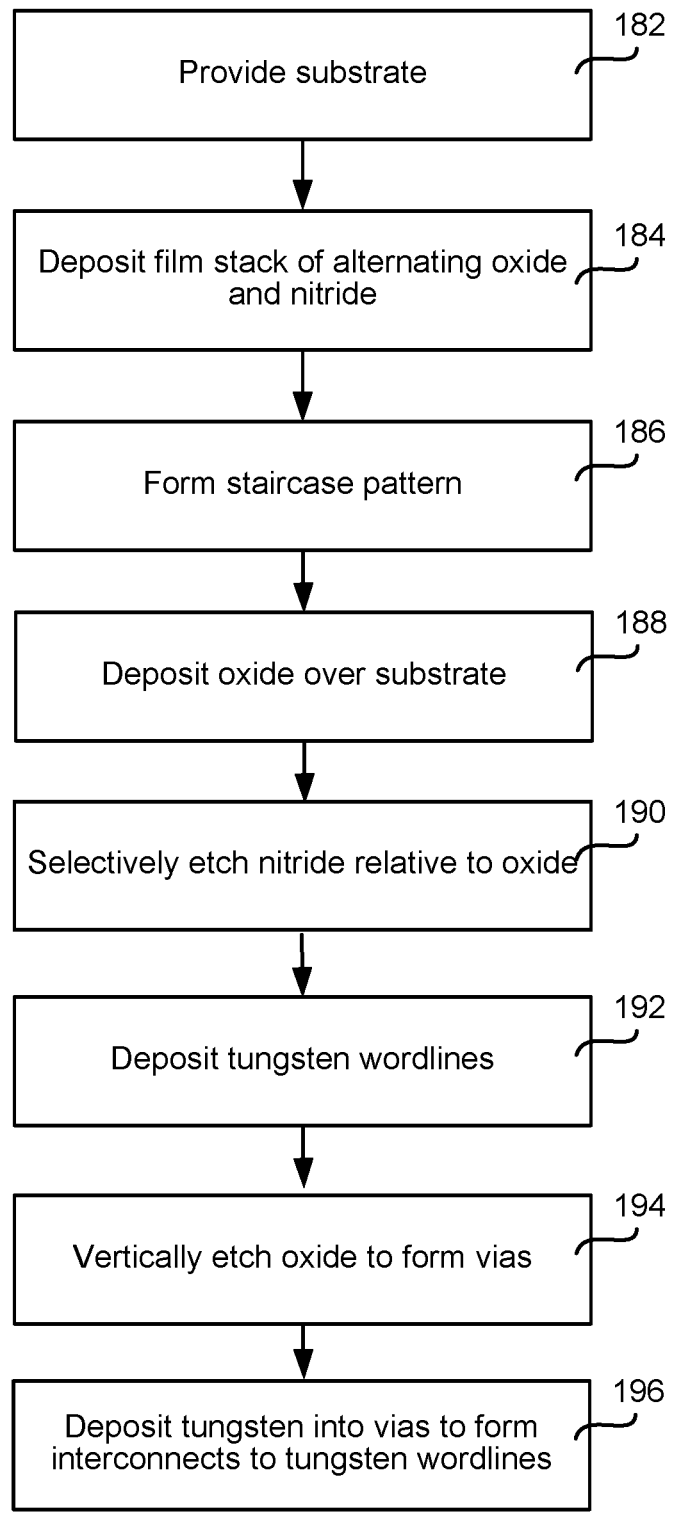
FIG. 1 is a process flow diagram of operations performed in accordance with a method for forming a 3D NAND structure.
Figure 2:
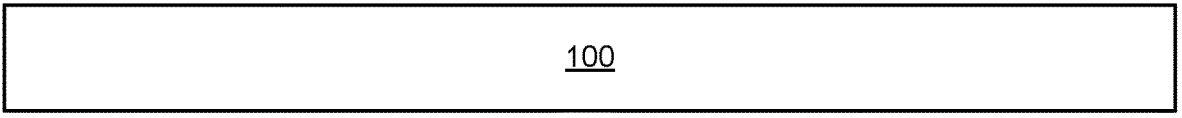
FIGS. 2, 3, 4A, 4B, 5A, 5B, and 6-8 are schematic illustrations of example cross-sections of a multi-layer stack during various operations of processing.

FIG. 1 shows a process flow diagram of operations performed in accordance with a method for forming a 3D NAND structure. In operation 182, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 2. Returning to FIG. 1, in operation 184, a film stack of alternating oxide and nitride films is deposited on the substrate. In various embodiments, the oxide layer deposited is a silicon oxide layer. In various embodiments, the nitride layer deposited is a silicon nitride layer. Each oxide and nitride layer is deposited to about the same thickness, such as between about 10 nm and about 100 nm, or about 350 Å in some embodiments. The oxide layers may be deposited at a deposition temperature of between about room temperature and about 600° C. It will be understood that "deposition temperature" (or "substrate temperature") as used herein refers to the temperature that the pedestal holding the substrate is set to during deposition.

Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), physical vapor deposition (PVD), or sputtering. In various embodiments, the oxide and nitride layers are deposited by PECVD.

The film stack may include between 48 and 512 layers of alternating oxide and nitride layers, whereby each oxide or nitride layer constitutes one layer. In some embodiments, the film stack may include less than 48 layers, or greater than 512 layers of alternating oxide and nitride layers, depending on the application. The film stack including the alternating oxide and nitride layers may be referred to as an ONON stack. While the film stack described involves alternating oxide and nitride layers, it will be understood that additional layers may also be included in the stack, and further that other materials may be used for alternating layers that are not oxide and not nitride layers. For example, in some cases, a silicon germanium layer may be used in lieu of a nitride or silicon nitride layer. Other additional layers that may be on the stack include silicon-containing layers, germanium-containing layers, or both. Example silicon-containing layers include doped and undoped silicon carbide layers, doped and undoped polysilicon layers, amorphous silicon layers, doped and undoped silicon oxide layers, and doped and undoped silicon nitride layers. Dopants may include non-metal dopants. For example, one example doped silicon carbide layer is an oxygen-doped silicon carbide. In another example, one example doped silicon carbide layer is a nitrogen-doped silicon carbide.

Figure 3:
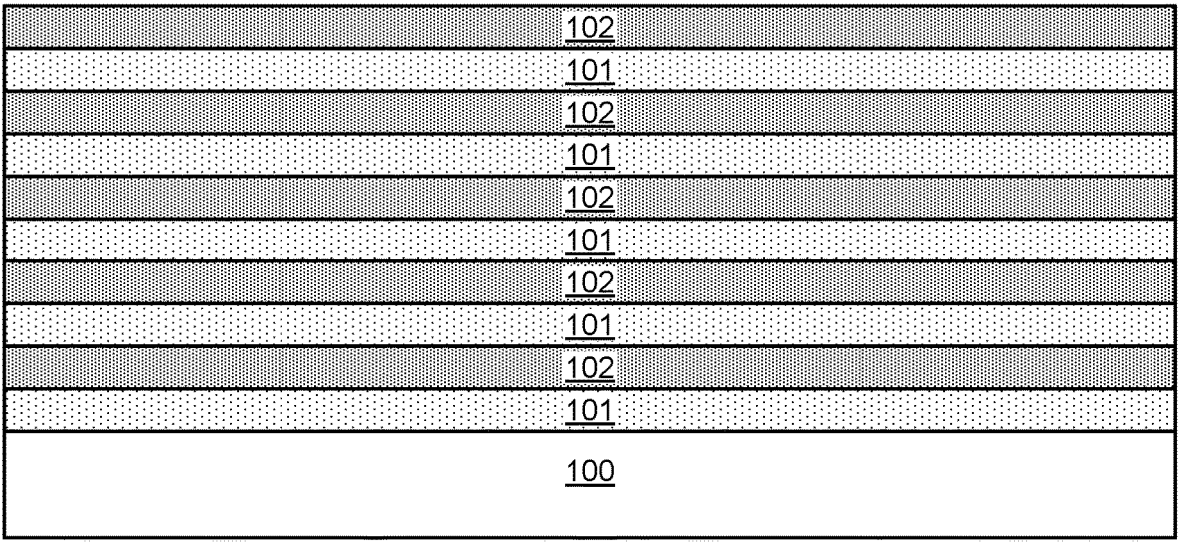

FIG. 3 shows an example schematic illustration of a substrate 100 with alternating oxide (101) and nitride (102) films deposited on the substrate 100. Note that while the structure shown in FIG. 3 shows an oxide deposited first, followed by nitride, oxide, nitride, etc., nitride may be deposited first, followed by oxide, nitride, oxide, etc.

Following deposition of the ONON stack, channels (not shown in FIG. 3) may be etched in the substrate. Subsequently, referring to FIG. 1, in operation 186, a staircase pattern is formed on the substrate. A "staircase pattern" as referred to herein includes two or more steps, each step including an oxide and a nitride layer. It will be understood that the top layer of each set of oxide and nitride layers may be either an oxide or a nitride for formation of steps in a staircase. In various embodiments, the staircase pattern includes between 24 and 256 steps. The staircase pattern may be formed using a variety of patterning techniques. For example, one technique may include depositing a sacrificial layer over the substrate and masking regions of the substrate to etch each set of oxide and nitride layers to form the staircase.

Figure 4A:
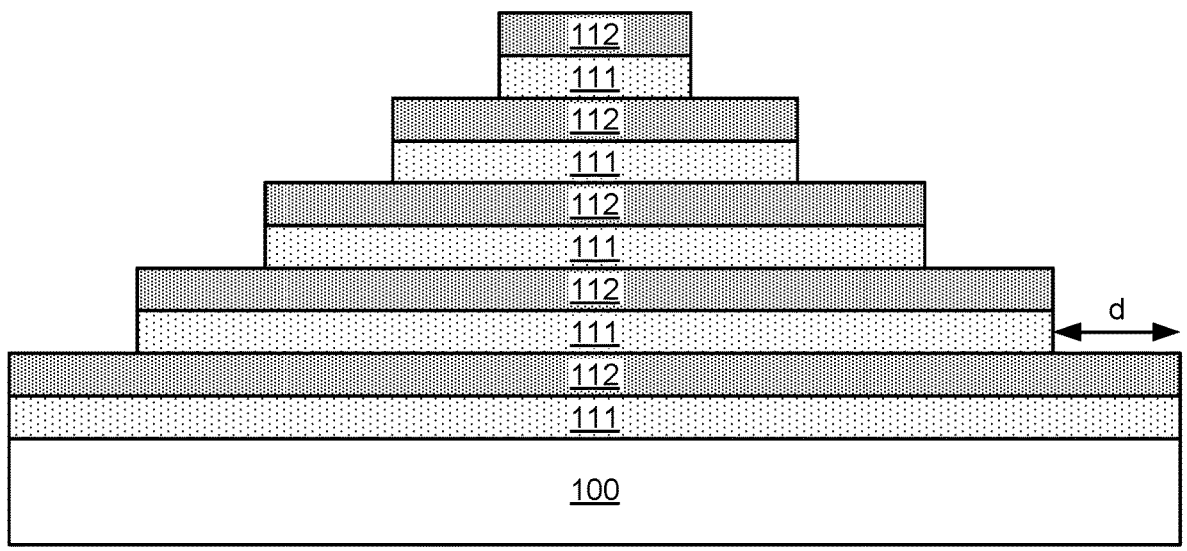

FIG. 4A provides an example of a substrate 100 including a staircase pattern of oxide (111) and nitride (112) layers with a hardmask 110 over the topmost nitride layer. Although FIG. 4A shows four steps of a staircase pattern, it will be understood that a staircase pattern may have between 24 and 256 steps. Each step includes a nitride and oxide layer, and distance d as shown in FIG. 4A may be between about 150 nm and about 1000 nm, such as about 500 nm. This region of each step extending out from the edge of the step above it may be referred to as a "pad" having a particular distance d.

Figure 4B:
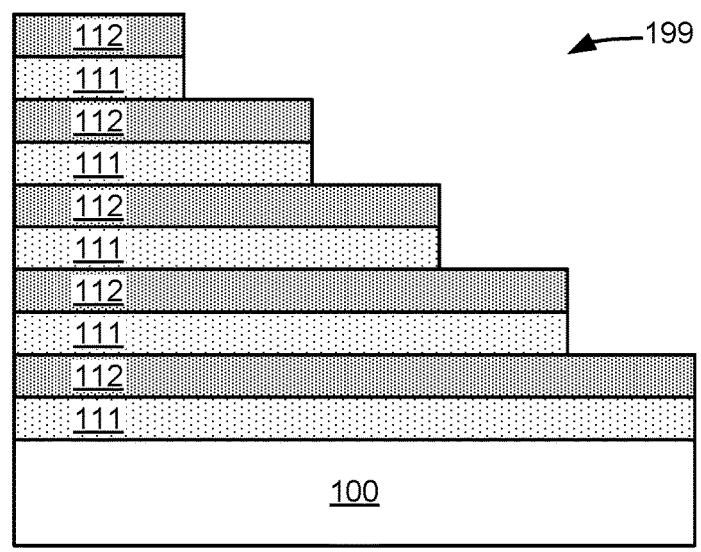

For purposes of discussion, the following discussion and subsequent schematic illustrations of the substrate will include a half view 199 as shown in FIG. 4B.

Figure 5A:
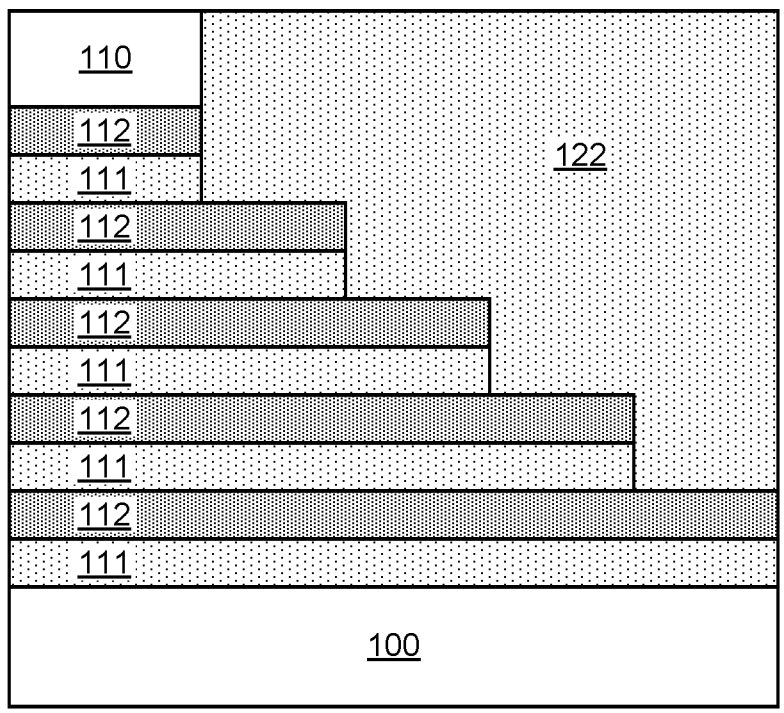
Figure 5B:
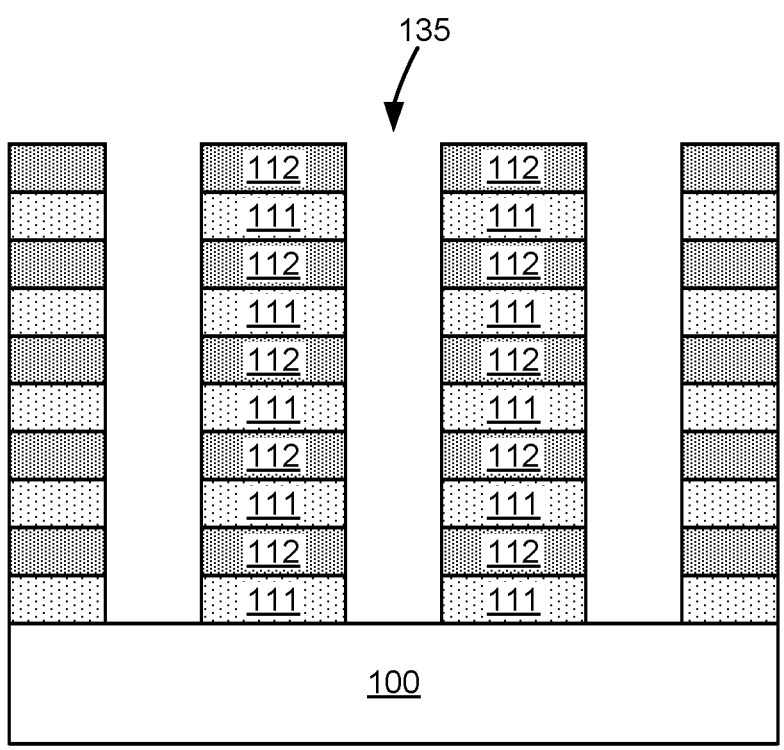

In operation 188 of FIG. 1, oxide is deposited over the substrate. In various embodiments, the oxide may be the same composition as the oxide deposited in layers of the ONON stack. In various embodiments, the oxide deposited over the substrate is deposited at a different deposition temperature than the deposition temperature used for depositing the oxide layers in the ONON stack. The deposition temperature may be between room temperature and about 600° C. Vertical slits 135 may be subsequently etched into the substrate after depositing oxide. FIG. 5A shows an example substrate 100 including the ONON staircase, hardmask 110, and oxide 122 deposited over the substrate. FIG. 5B shows a side view of the substrate 100 after vertical slits 130 are etched.

Figure 6:
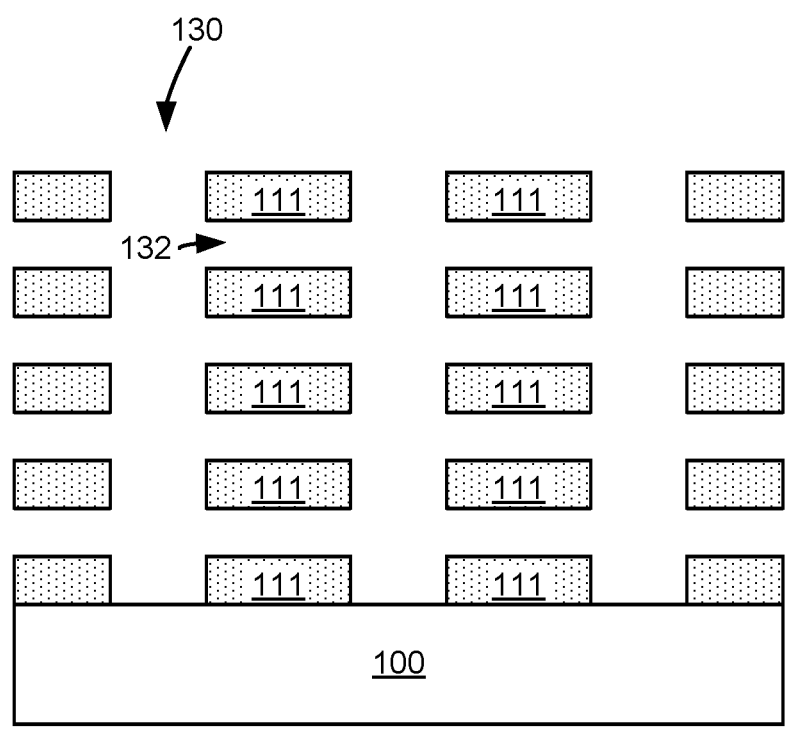

Returning to FIG. 1, in operation 190, nitride is selectively etched relative to oxide on the substrate. Etching may be performed using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). This operation removes the nitride layers from the ONON stack such that etch species flow into the vertical slit and selectively etches nitride. It will be understood that the selective etching involves etching a first material at a rate faster than etching a second material. For example, selectively etching nitride relative to oxide means nitride is etched at a faster rate than etching of oxide. Nitride is selectively etched using a wet etch process, such as by exposing the substrate to phosphoric acid ($H_3PO_4$) and/or diluted hydrofluoric acid ("DHF") or a mixture of these solutions. FIG. 6 shows a side view of a cross-section of the substrate whereby gaps 132 are formed from selectively etching nitride.

Figure 7:
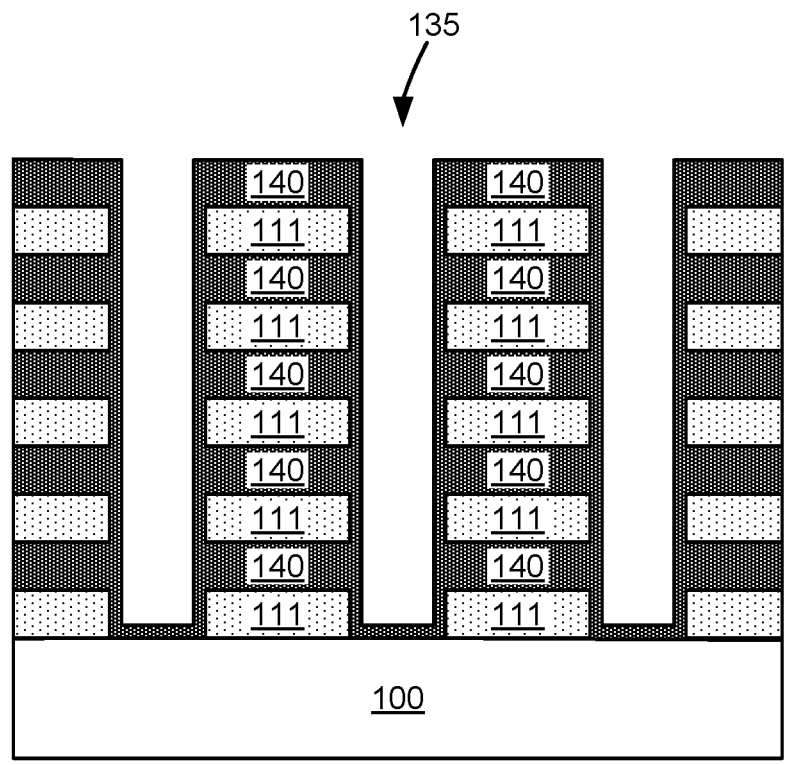

Returning to FIG. 1, in operation 192, tungsten is deposited into the gaps of the substrate to form tungsten wordlines. Tungsten may be deposited by any suitable technique, such as ALD, CVD, PEALD, and/or PECVD. In some embodiments, a barrier layer and/or a tungsten nucleation layer is deposited prior to depositing bulk tungsten. Example barrier layers include titanium nitride, aluminum oxide, and tungsten carbonitride. FIG. 7 shows a schematic illustration of a cross-section of the substrate from a side view with tungsten 140 deposited in the gaps where nitride was previously. As shown, metal deposition may result in deposition on sidewalls of the oxide 111. Although tungsten is described herein, other metals, such as molybdenum, may be used.

Figure 8:
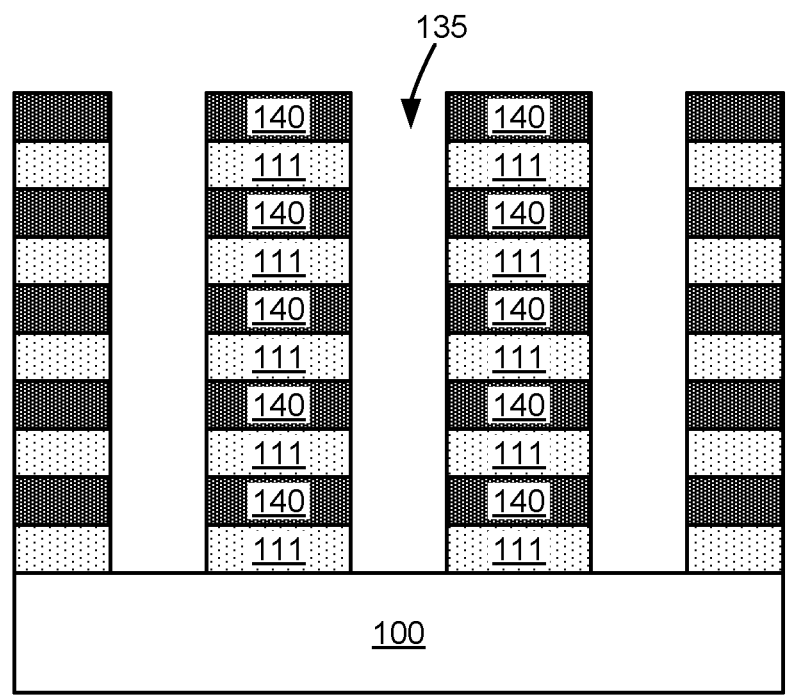

Returning to FIG. 1, in operation 194, vias are formed by etching the substrate vertically, which can include both etching the deposited oxide over the staircase as well as etching metal to remove metal from the sidewalls of the oxide in the alternating layers. The oxide may be etched by dry etching using exposure to one or more of the following gases: $O_2$, Ar, $C_4F_6$, $C_4F_8$, $SF_6$, $CHF_3$, and $CF_4$. FIG. 8 shows an example substrate 100 including the ONON stack in a staircase pattern whereby vias 135 are etched in the stack.

In FIG. 1, in operation 196, tungsten may be deposited in the vias to form interconnects to the tungsten wordlines. Vias vary in depth and may have a depth between about 1 micron and about 12 microns. Shallow vias may be defined as having a depth less than 3.0 microns, such as between about 1.5 microns and 3.0 microns. Deep vias may have a depth greater than 3.0 microns. The critical dimension of vias formed in the oxide may be between about 50 nm and about 500 nm. Vias may be etched using a dry etch process which may involve masking operations to pattern the oxide. In various embodiments, a patterning process may include more operations not shown in FIG. 1. For example, after depositing oxide over the substrate in operation 188, a channel may be etched to form a channel. The channel may be filled with a charge trapping layer, and a large trench or slit is etched prior to selectively etching nitride in operation 190. Prior to vertically etching oxide and after depositing a tungsten wordline, tungsten may be removed from sidewalls.

FIG. 1 provides an example where tungsten backfill is deposited by CVD for ONON gate replacement. Such techniques may be used for ONON or OPOP integration schemes for forming memory cell stacks, such as in some embodiments where polysilicon remains as the gate for the OPOP scheme. Both the ONON and OPOP schemes can be etched in this way without significant risk. However, application of such techniques to complex multi-layer stacks presents a challenge.

For example, a layer may include silicon oxide, tungsten, polysilicon, and another dielectric in the final structure. This may involve recessing the sidewall of the dielectric, similar to floating gate formation in an OPOP scheme. While one approach is to etch a film stack that contains silicon oxide, silicon nitride, polysilicon, and tungsten and titanium nitride followed by the recess of silicon oxide or silicon nitride, utilizing the wet etch contrast between silicon oxide, silicon nitride, polysilicon, and tungsten, such as described with respect to FIGS. 9A-9D, such processes present some challenges.

FIGS. 9A-9D show another set of schematic illustrations for processing a different multi-layer stack. FIG. 9A includes a silicon nitride layer 902, tungsten layer 940 (with optional titanium nitride liner (not shown) between the tungsten layer 940 and silicon nitride layer 902), polysilicon layer 900 (with optional titanium nitride layer (also not shown) between tungsten layer 940 and polysilicon layer 900), silicon oxide layer 901, and silicon nitride layer 902. Here, in FIG. 9B, a via or trench 950 is etched, which involves etching all of the above identified materials in the stack, including metal, which can result in undesirable metal residue on the substrate. Silicon oxide 901 may be further recessed to form the structure for this substrate. In FIG. 9C, polysilicon 900 is filled in to fill into the recessed regions adjacent the silicon oxide 901. In FIG. 9D, the polysilicon 900 is further etched to form the vias again to therefore include the structure as shown in FIG. 9D.

However, such processes involve etching tungsten and/or metal as well as other silicon-containing materials, which can be challenging. First, etching a multi-layer stack of dielectric and metal while maintaining a vertical profile is very difficult, partly due to the varying etch rates and the etch chemistries used for different materials. This may result in feature collapse and degradation of the feature profile. Secondly, metal residue left in a high aspect ratio structure is very difficult to clean and the metal residue can impact the device integrity. Thirdly, the deposition of a tungsten film can lead to formation of a rough surface and can cause device performance control problems.

Provided herein are methods and apparatuses for forming and etching a multiple film stack to perform high aspect ratio patterning and vertical and three-dimensional scaling. A multiple film stack may include repeated sets of layers deposited one on top of another. Each set of layers may include at least three different materials. In some embodiments, each set includes four different materials. The same set of layers may be stacked one on top of another many times, such as about 5 times, or such as about 10 times, or such as about 20 times, or more.

High aspect ratio vias or trenches patterned using certain disclosed embodiments may have an aspect ratio greater than about 5:1, or between about 5:1 and about 20:1, or between about 25:1 and about 35:1, or greater. Some embodiments involve replacing metal in a film stack with another dielectric that has a similar dry etch behavior as other materials, while exhibiting strong wet etch contrast to other materials. For example, wet etch contrast of the dielectric that replaced the metal may be about 10:1 relative to other materials in 100:1 dilute hydrofluoric acid or phosphoric acid. Disclosed embodiments may be performed to form structures having both metal and dielectric material without risk of causing metal residue on the substrate. In various embodiments, as metal is deposited after patterning the structure, etching a substrate having both metal and dielectric material is avoided. That is, in various embodiments, a metal-free film stack is etched and processed without the presence of metal such that a dielectric material is deposited and positioned in the region where metal is to be later deposited, and after the desired structure is formed, the dielectric material is removed and metal is subsequently deposited in its place to form a desired pattern or device. Certain disclosed embodiments involve process integration of forming a structure including dielectric material and a sacrificial layer in the regions where metal is later to be deposited, etching the sacrificial layer after patterning to leave spaces in the structure, and depositing the metal into the spaces. Disclosed embodiments can be advantageous for performing sidewall recess to form a particular device, such as a floating gate. Certain disclosed embodiments also allow better profile control.

Certain disclosed embodiments can be used to forego etching tungsten in a multi-layer stack by using a silicon nitride sacrificial material to etch a pattern, followed by selectively removing silicon nitride utilizing etch contrast between silicon nitride and other dielectric materials to yield spaces, followed by depositing metal into the spaces. Where the multi-layer stack also includes other silicon nitride layers that are not sacrificial, those materials may be replaced with oxygen-doped silicon carbide, which can both allow etch contrast when selectively removing silicon nitride and provide properties similar to that of silicon nitride to perform the function of that particular layer. The dielectric layer described herein, such as SiOC, will have wet etch contrast during SiN removal and SiO2 recess, but has similar dry etch behavior during high aspect ratio patterning. The dielectric can also be other materials that provide similar performance. Such material can be polysilicon with different dopants, or SiN that is deposited under different process conditions that have very different wet etch rate from the sacrificial SiN, or a nitrogen doped SiC (SiNC).

Disclosed embodiments may be used for a variety of applications, including fabrication of 3D-NAND devices, floating gates, and the like. Described herein is one example of a particular stack that may be formed using certain disclosed embodiments; it will be understood that other materials and other patterning schemes and stacks may be formed using certain disclosed embodiments and disclosed embodiments are not limited to this example.

In certain disclosed embodiments, the stack is deposited using silicon nitride as a sacrificial layer where the metal may be later deposited, such that the sacrificial layer may be removed after etching operations to form spaces for the metal material, and metal is backfilled into the spaces. Although tungsten is described herein as an example metal, it will be understood that other metals, such as molybdenum, may be used. In another embodiment, in lieu of silicon nitride as a sacrificial layer, polysilicon material, or doped polysilicon, may be used. Where other silicon nitride films (top and bottom films in the stack provided) are present in the stack to be fabricated, such layers are replaced with oxygen-doped silicon carbide to avoid etching those layers when the sacrificial silicon nitride layer is removed. One advantage of oxygen-doped silicon carbide is that it can provide etch contrast to the other materials on the substrate including silicon nitride and polysilicon when the removal or recess of SiN, poly, or SiO$_2$ is performed.

Thus, an alternating stack of oxygen-doped silicon carbide and silicon oxide may be formed, silicon nitride may be used as a sacrificial layer where tungsten will later be deposited, and silicon oxide may be recessed prior to depositing polysilicon as silicon oxide can be etched with etch contrast to oxygen-doped silicon carbide and silicon nitride. In some embodiments, silicon oxide may be recessed with etch contrast to nitrogen-doped silicon carbide and silicon nitride. In some embodiments, silicon oxide can be etched with etch contrast to oxygen-doped silicon carbide and silicon germanium. In some embodiments, silicon oxide may be recessed with etch contrast to any other non-silicon oxide materials on the substrate, including but not limited to nitrogen-doped silicon carbide, doped Si, silicon nitride, and silicon germanium. After depositing polysilicon and any other patterning processes, the silicon nitride sacrificial layer may be selectively removed using a wet etch process. Titanium nitride liners may be optionally deposited and tungsten is deposited in regions where the silicon nitride sacrificial layer previously occupied. Such process avoids patterning with tungsten on the stack, thereby reducing the redeposition of tungsten on the substrate. Additionally, the tungsten material in the stack is not subject to various process conditions that may warp and/or modify the grain structure of the tungsten material because tungsten is deposited after all other processes have been performed. Etching of the stack is simplified because etch chemistries are not limited to chemistries that can etch tungsten; rather, materials on the stack are all silicon-containing materials and may be etched with accuracy using a variety of existing etch processes.

Certain disclosed embodiments involve depositing a metal-free multi-layer stack having at least three different materials, at least one of these materials being a sacrificial layer. The term "metal-free" used herein includes silicon-containing materials; that is, metal-free refers primarily to materials that do not include a transition metal or metalloid but includes semiconducting materials. Example metal-free materials include but are not limited to silicon nitride, silicon carbide, doped silicon carbide, silicon oxide, amorphous silicon, doped silicon, and polysilicon. In various embodiments, the metal-free stack does not include tungsten. In various embodiments, the metal-free stack is tungsten-free. The sacrificial layer is used during etching and patterning of the multi-layer stack; the sacrificial layer can be used to avoid etching metal. Following patterning, the sacrificial layer may be then etched and replaced with metal material for a resulting structure. For example, in some embodiments, a metal-free multi-layer stack having at least three different materials is deposited, a trench or via is etched in the metal-free multi-layer stack, and after etching, the sacrificial layer is selectively etched relative to other materials of the stack to form a space, and metal is deposited in the space. In various embodiments, a metal-free multi-layer stack has four different silicon-containing materials. In some embodiments, a metal-free multi-layer stack has four different metal-free materials. In some embodiments, "different" material refers to materials having different molecular or atomic composition, or different grain structure, or different lattice structure. Selective etching of the sacrificial layer may be achievable by using etch contrast between materials when exposed to various etchants including liquid etchants.

In various embodiments, the sacrificial layer may be a polysilicon or silicon nitride material. Etch contrast for a silicon nitride sacrificial layer may be achieved by using other materials in the multi-layer stack, including but not limited to silicon oxide, oxygen-doped silicon carbide or silicon oxycarbide, and polysilicon. Etch contrast for a polysilicon sacrificial layer may be achieved by using etchants whereby polysilicon etches substantially faster than other materials on the substrate. Even if other materials on the stack include polysilicon, using a difference in dopant concentration in the polysilicon can be used to achieve etch contrast. The dopant concentration in polysilicon can be between about 1E19 atoms/cm$^3$ to about 1E20 atoms/cm$^3$. For example, in some embodiments, the multi-layer stack may include boron-doped polysilicon while the sacrificial layer includes undoped polysilicon such that undoped polysilicon is capable of being etched with etch contrast to boron-doped polysilicon to leave spaces for later metal deposition. It will be understood that metal deposition may be performed by first depositing a liner layer, such as but not limited to titanium nitride, followed by metal deposition.

Different variations of the multi-layer stack may be used. For example, in some embodiments, the multi-layer stack includes silicon nitride, silicon oxide, and oxygen-doped silicon carbide. In some embodiments, the terms silicon oxycarbide and oxygen-doped silicon carbide may be used interchangeably. In some embodiments, the multi-layer stack includes polysilicon, silicon oxide, and oxygen-doped silicon carbide. In some embodiments, the multi-layer stack includes polysilicon, silicon nitride, silicon oxide, and oxygen-doped silicon carbide.

In some embodiments, the multi-layer stack includes alternating layers of silicon nitride and non-oxide layers, and a trench or via is etched in the multi-layer stack, followed by selectively etching the silicon nitride to form spaces between the non-oxide layers. Metal may then be deposited into the spaces. The non-oxide layer may be silicon oxycarbide, polysilicon, or a silicon nitride material having wet etch contrast to the other silicon nitride material. In some embodiments, the multi-layer stack that includes the alternating layers also includes another layer having a material different from the silicon nitride or the non-oxide layer. This layer may be a dielectric barrier layer. In some embodiments, this layer is not a dielectric barrier layer. In some embodiments, this layer is not a dielectric material. In some embodiments, this other layer having material different from the silicon nitride and non-oxide layer is an oxygen-doped silicon carbide layer. In some embodiments, this other layer is used to achieve etch contrast when etching silicon nitride. In some embodiments, this multi-layer stack may be used to form a 3D NAND structure.

As described herein, oxygen-doped silicon carbide or silicon oxycarbide has an oxygen concentration of between about 1% and about 65% atomic.

Figure 10:
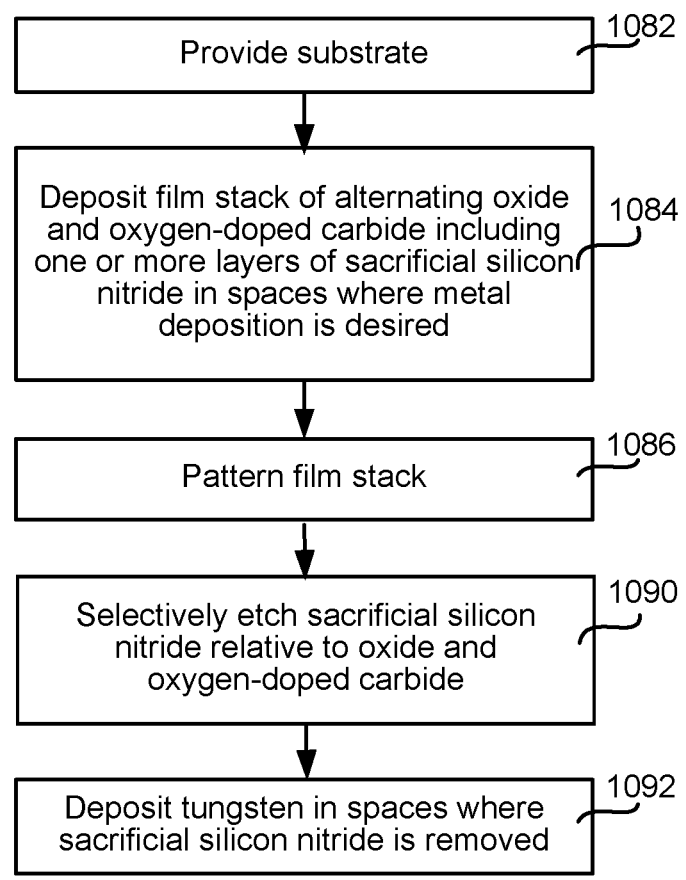
FIG. 10 is a process flow diagram of operations performed in accordance with certain disclosed embodiments.

FIG. 10 is a process flow diagram depicting operations performed in accordance with certain disclosed embodiments. In operation 1082, a substrate is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In operation 1084, a film stack including, oxide and, oxygen-doped carbide, and one or more layers of sacrificial silicon nitride is deposited where the sacrificial silicon nitride is deposited in spaces where metal is desired in the resulting structure. Although silicon oxide, silicon nitride, and oxygen-doped silicon carbide are described herein, it will be understood that in some embodiments, other oxides, nitrides, and oxygen-doped carbides may be used.

Silicon oxygen-doped carbide may be deposited by plasma enhanced chemical vapor deposition by introducing a silicon-containing precursor, an oxygen-containing reactant, and a carbon-containing reactant while igniting a plasma.

Precursor molecules for depositing silicon carbides can include silicon-containing molecules having silicon-hydrogen (Si—H) and/or silicon-silicon (Si—Si) bonds, and silicon-carbon (Si—C) bonds. In some embodiments, precursor molecules for depositing a silicon carbide layer may be a silicon-containing and carbon-containing precursor. Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon carbonitrides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. In some embodiments, the silicon-containing precursors can include a reactant with Si—O bonds and a reactant with Si—C bonds. It will be understood that any number of suitable reactants may be employed in the scope of this present disclosure. The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in a deposited silicon carbide film. The broken bonds can also serve as sites for cross-linking during thermal processing conducted during or after deposition. Bonding at the reactive sites and cross-linking can form a primary backbone or matrix collectively in the resulting silicon carbide film. In lieu of oxygen-doped silicon carbide, in some embodiments, silicon carbide, nitrogen-doped silicon carbide, boron-and-nitrogen-doped silicon carbide, and combinations thereof including combinations with oxygen-doped silicon carbide may be used.

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an oxygen doped silicon carbide film, with the size of the pores corresponding to the radius of the ring. For example, a cyclotetrasiloxane ring can have a radius of about 6.7 Å.

In some embodiments, the siloxane may have a three-dimensional or caged structure. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into an oxygen doped silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ($(CH_3)_2Si$—$CH_2$—$Si(CH_3)_3$), and dimethylsilane (2MS).

In some embodiments, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

In some embodiments, two or more different chemical sources may be used. For example, one chemical source may include silicon while a second chemical source includes carbon. In some embodiments, a chemical source including silicon may be TEOS or any silane such as described above. In some embodiments, a chemical source including carbon may include methane, alkanes (such as ethane ($C_2H_6$)), alkenes (such as ethylene ($C_2H_4$)), and alkynes (such as $C_2H_3$).

In depositing silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film.

Some silicon carbide films in the multi-layer stack may have high breakdown voltages and low leakage currents. An example of a breakdown voltage achieved by certain disclosed embodiments is about 4 MV/cm. An example of low leakage current achieved by certain disclosed embodiments is about 1E-8 at 2 MV/cm.

In some embodiments, the process conditions can substantially preserve Si—C bonds and, if present, Si—O and Si—N bonds in the as-deposited layer of the silicon carbide film. Accordingly, the reaction conditions adjacent to the substrate provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, as discussed below, introduction of a co-reactant such as oxygen may extract carbon from Si—C bonds. Generally, the described reaction conditions exist at the exposed face of the substrate (the face where the silicon carbide film is deposited). They may further exist at some distance above the substrate, e.g., about 0.5 micrometers to about 150 millimeters above the substrate. In effect, activation of the precursor can happen in the gas phase at a substantial distance above the substrate. Typically, the pertinent reaction conditions will be uniform or substantially uniform over the entire exposed face of the substrate, although certain applications may permit some variation.

The silicon-containing precursors are typically delivered with other species, notably carrier gas, in the environment adjacent to the substrate. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, nitrogen ($N_2$), argon (Ar), and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film at a relatively low concentration. The multiple precursors may be present in equimolar or relatively similar proportions as appropriate to form the primary backbone or matrix in the resulting silicon carbide film. In other embodiments, the relative amounts of the different precursors are substantially skewed from equimolarity.

For depositing silicon oxide, one or more silicon-containing precursors may be used. Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). In various embodiments, a plasma may not be used during deposition of any one of the layers of the multi-layer stack. In some embodiments, a plasma may be used during deposition of any one of the layers of the multi-layer stack.

Example techniques for depositing some layers described herein are provided in U.S. Pat. Nos. 8,741,394, 9,028,924, and U.S. Patent Application Publication No. 2011/0236594, which are herein incorporated by reference in their entireties.

Oxygen doping may be modulated using certain techniques such as modulating temperature, pressure, plasma power and frequency, as well as oxygen-containing reactant gas flow relative to other gas flows The amount of oxygen doping can affect the relative etch contrasts. For example, silicon nitride may have a certain etch contrast of about 0% to about 65% relative to oxygen doped silicon carbide, whereas the same material may have a lower etch contrast relative to 66% oxygen-doped silicon carbide at the same process conditions. Silicon nitride has etch contrast to silicon oxide in hot phosphoric acid ($H_3PO_4$). Silicon oxycarbide can be used to provide wet etch contrast to both silicon nitride in $H_3PO_4$ wet etch and to silicon oxide in hydrofluoric acid (HF) wet etch.

Returning to FIG. 10, in operation 1086, any pattern may be etched on the substrate. For example, in some embodiments, a trench or via is etched through the multi-layer stack, which can be performed using existing dielectric etching techniques without any metal residue or risk of deteriorating the etch profile. For example, this operation may involve recessing the silicon oxide material, which can be performed because oxygen-doped silicon carbide, silicon nitride, and polysilicon can provide sufficient etch contrast to etching of silicon oxide. In various embodiments, the etch chemistry used to pattern the stack includes one or more of tetrafluoromethane ($CF_4$), fluoromethane ($CFH_3$), difluoromethane ($CH_2F_2$), octafluorocyclobutane ($C_4F_8$), and nitrogen trifluoride ($NF_3$). Patterning may be performed to etch a trench or via. In some embodiments, this operation may not include silicon oxide recess operation.

During patterning in operation 1086, etch contrast may vary depending on the materials in the stack. In some embodiments, silicon oxide is recessed after etching a trench such that silicon oxide is selectively removed from sidewalls in the trench, thereby causing the trench to have varying width at particular depths within the stack. For example, a trench may be etched into a stack including silicon nitride, silicon oxide, and polysilicon with silicon oxide between silicon nitride and polysilicon, and silicon oxide may be subsequently etched in the trenches such that the sidewalls of the trenches having silicon oxide are recessed. Recess of silicon oxide may be performed using particular etch chemistries that have etch contrast relative to other materials on the substrate. In various embodiments, silicon oxide etches between about 5 and about 1000 times faster than silicon nitride, polysilicon, and oxygen-doped silicon carbide.

Silicon oxide is provided as an example. In some embodiments, a dielectric material is recessed such that the dielectric material is selectively removed from sidewalls of the trench. Example dielectric materials include but are not limited to silicon oxide and doped silicon oxides.

In operation 1090, the sacrificial silicon nitride material is selectively etched from the substrate relative to the other materials on the substrate (polysilicon, oxide, oxygen-doped silicon carbide). This operation may be performed using the etch contrast of sacrificial silicon nitride relative to these materials in a wet etch process. For example, in some embodiments, sacrificial silicon nitride may be etched by dipping the substrate in hot $H_3PO_4$. Etching in this manner will result in formation of spaces in locations where the silicon nitride previously occupied on the substrate. Etch selectivity of silicon nitride relative to other materials on the substrate may be between about 10 and about 1000, where other materials are silicon oxide, oxygen-doped silicon carbide, and polysilicon.

In operation 1092, tungsten is deposited in the spaces where the sacrificial silicon nitride material was previously occupied on the substrate. For example, tungsten can be deposited into the horizontal spaces between oxide layers. In some embodiments, prior to depositing the metal, a metal-containing liner is deposited. The metal-containing liner may be titanium nitride, aluminum oxide, or tungsten carbonitride in various embodiments. The metal deposited in operation 1092 may be deposited directly on or over the metal-containing liner. For example, tungsten may be deposited on a titanium nitride liner.

FIG. 11A shows an example process flow diagram depicting operations performed in accordance with certain disclosed embodiments. In this example, a substrate is provided in operation 1282. In operation 1284, a metal-free film stack is deposited such as described with respect to FIG. 9A, and below, 12A. In operation 1285, trenches are etched in the metal-free stack. In various embodiments, the trench etched has a high aspect ratio, such as between about 5:1 and about 20:1. In various embodiments, the width of the trench is between about 30 nm and about 200 nm. In operation 1286, silicon oxide may be recessed. In various embodiments, silicon oxide recess is performed such that the etch rate of the silicon oxide is at least about 50 times faster than that of other materials in the metal-free stack. Silicon oxide recess may be performed using any suitable etch chemistry, including but not limited to halogen-based chemistries such as hydrofluoric acid. In operation 1290, the sacrificial silicon nitride layer is selectively removed. In various embodiments, the sacrificial silicon nitride layer is etched using a wet etch phosphorous based chemistry, such as by using diluted $H_3PO_4$. In operation 1292, tungsten is deposited where sacrificial silicon nitride is removed.

FIG. 11B shows yet another example process flow diagram depicting operations performed in accordance with certain disclosed embodiments. In this example, a substrate is provided in operation 1182. In operation 1184, a film stack is deposited such that, multiple sets of the following film stack, from top to bottom, are deposited on top of one another: oxygen-doped silicon carbide, silicon nitride, doped polysilicon, silicon oxide, doped polysilicon, and silicon nitride. In operation 1186a, silicon oxide may be recessed. In operation 1186b, polysilicon is filled in the substrate. In some embodiments, the material used to fill the substrate may be a dielectric or semiconductor material. In operation 1190, the sacrificial silicon nitride layer is selectively removed. In operation 1192, tungsten is deposited where sacrificial silicon nitride is removed.

FIGS. 12A-12E show example schematic illustrations of various substrates undergoing certain disclosed process embodiments.

In FIG. 12A, as compared to FIG. 9, a substrate is provided having oxygen-doped silicon carbide 400, sacrificial silicon nitride layer 402, polysilicon 100, silicon oxide 101, and oxygen-doped silicon carbide 400. In FIG. 12B, a trench is formed and the silicon oxide 101 is recessed. In FIG. 12C, polysilicon 100 is deposited to fill in the space where the silicon oxide 101 was recessed. In some embodiments, polysilicon 100 may be etched back in an operation between FIGS. 12C and 12D. In FIG. 12D, the sacrificial silicon nitride layer 402 is selectively removed, such as by wet etching. In FIG. 12E, tungsten 440 is deposited into the spaces where the silicon nitride layer previously occupied. This avoids etching tungsten during formation of vias and during silicon oxide recess as tungsten does not deposit on sidewalls of the trench or via previously patterned due to the presence of polysilicon 100 in the structure.

In various embodiments, oxygen-doped silicon carbide, which may be deposited by PECVD, replaces silicon nitride, and silicon nitride replaces tungsten and titanium nitride. The high aspect ratio etch of the film stack has lower risk since the materials used can be etched using techniques developed for OPOP and ONON etch processes, and no metal residue risk. The silicon oxide can be recessed in a similar manner since the oxygen-doped silicon carbide, silicon nitride, and polysilicon will provide sufficient etch contrast. Finally, silicon nitride can be removed and backfilled with titanium nitride and tungsten and tungsten roughness will not be a concern since the surface will be constrained by the dielectric sidewall.

Another approach is to replace the tungsten and titanium nitride with doped polysilicon. This will simplify the etch process by, in some cases, changing the number of materials to be etched from 5 to 3 for high aspect ratio etch. However, since doped poly and undoped poly have very different wet eth crates, the doped poly can be removed by wet etch and then backfilled with titanium nitride and tungsten. Example dopants include boron, phosphorous, and arsenic.

A variety of dopant precursors may be used during deposition of the doped polysilicon to form the doped polysilicon. In some embodiments, a suitable dopant source may be elemental arsenic, or arsine ($AsH_3$), or an arsenic-doped silicate glass (ASG), or an arsenic compound such as diarsenic trioxide ($As_2O_3$) and/or arsenic pentoxide ($As_2O_{5+}$). In other embodiments, a suitable dopant source may be elemental boron or a boron compound such as diborane ($B_2H_6$), and a suitable dopant precursor may be a boron compound such as an alkyl borate. For instance, trimethyl borate (TMB) (shown below) is a particular alkyl borate can perform well as a dopant precursor for forming the dopant source boron trioxide ($B_2O_3$); however other dopant precursors may also be suitable for forming various boron-based dopant sources. Furthermore, dopant sources based upon elements other than boron and arsenic may also be suitable, such as dopant sources based upon gallium or phosphorous, for example.

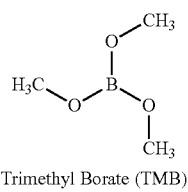
Trimethyl Borate (TMB)

Trimethyl borate is one suitable dopant precursor, however, depending on the embodiment, other compounds may also serve as suitable dopant precursors. For instance, other suitable boron-based dopant precursors may include: other alkyl borates such as triethyl borate, triisopropyl borate, and tri-n-butyl borate, as well as trimethylboron, triethylboron, triphenylboron, tri-i-propyl borate, tri-n-amyl borate, B-tri-bromoborazine, tris(pentafluorophenyl)borane, and other similar boron containing compounds. In addition, dopant sources based upon elements other than boron may also be suitable. Examples include dopant sources based upon gallium, phosphorous, arsenic, or other elements appropriate for doping a semiconductor substrate, such as other valence III and V elements. Dopant precursors based upon arsenic may include, but are not limited to, the alkylarsine, alkoxyarsine, and aminoarsine chemical families, and include, but are not limited to, the following specific compounds: arsine, triethylaresenate, trimethylarsine, triethylarsine, triphenylarsine, triphenylarsine oxide, ethylenebis(diphenylarsine), tris (dimethylamino)arsine, and $As(OR)_3$ where R is $—CH_3$ or $—C_2H_5$ or other alkyl groups (including saturated and unsaturated alkyl groups), and other similar arsenic containing compounds. Dopant precursors based upon phosphorous may include, but are not limited to, phosphine ($PH_3$), triethoxyphosphine oxide, trimethylphosphate, trimethylphosphite, and other similar phosphorous containing compounds. Choice of dopant precursor is typically dictated by ease of integration into existing delivery systems, purity of films, and overall cost.

Highly boron doped polysilicon can have a higher wet etch rate, therefore providing etch contrast to other materials on the substrate during patterning. Wet etch rate increase as boron concentration increases, thereby providing etch contrast that is tunable depending on the dopant concentration.

"Silicon oxide" is referred to herein as including any and all stoichiometric possibilities for $Si_xO_y$, including integer values of x and y and non-integer values of x and y, and some H in that can bond to Si or O. For example, "silicon oxide" includes compounds having the formula $SiO_n$, where $1<n<2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates.

"Silicon nitride" is referred to herein as including any and all stoichiometric possibilities for $Si_xN_y$, including integer values of x and y and non-integer values of x and y, such as x=3 and y=4. For example, "silicon nitride" includes compounds having the formula $SiN_n$, where $1<n<2$, where n can be an integer or non-integer values. "Silicon nitride" can include sub-stoichiometric compounds such as $SiN_{1.8}$. "Silicon nitride" also includes $Si_3N_4$ and silicon nitride with some and/or interstitial hydrogen (SiNH) and silicon nitride with trace amounts of and/or interstitial oxygen (SiON). "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities. Hydrogen will also be present in the SiN, and may bond to Si or N, or both. Hydrogen concentration in silicon nitride can range from about 1% to about 30%.

FIG. 12F-12M show yet another example patterning scheme with schematic illustrations of various substrates undergoing certain disclosed process embodiments.

Figure 12F:
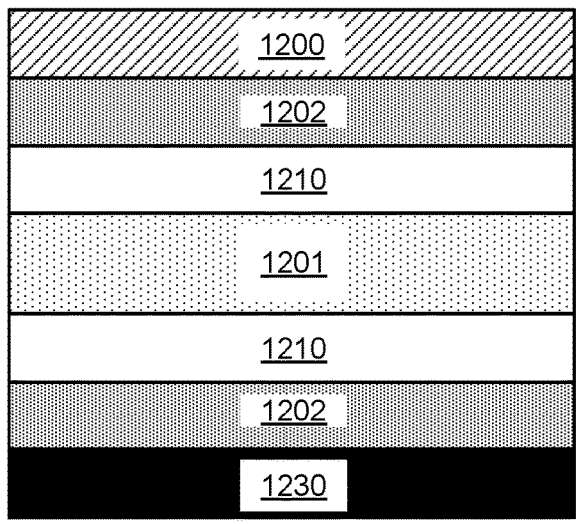
Figure 12G:
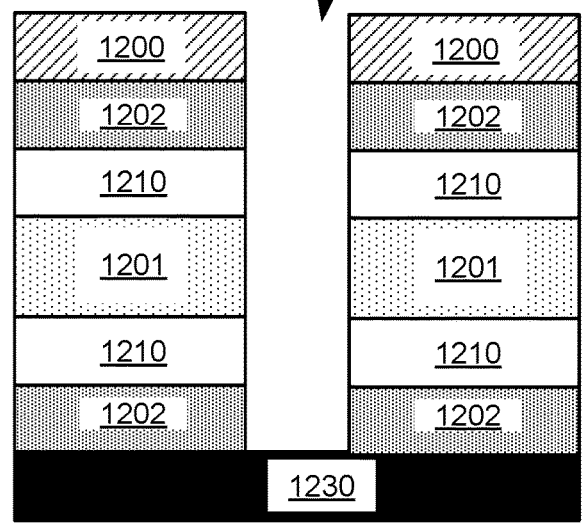
Figure 12H:
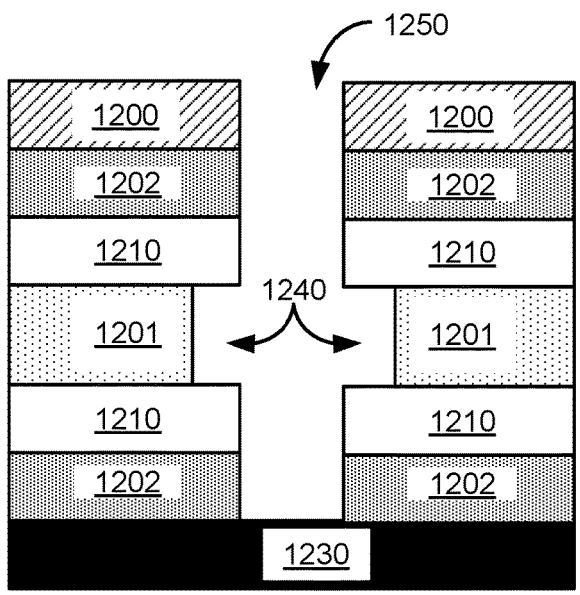
Figure 12I:
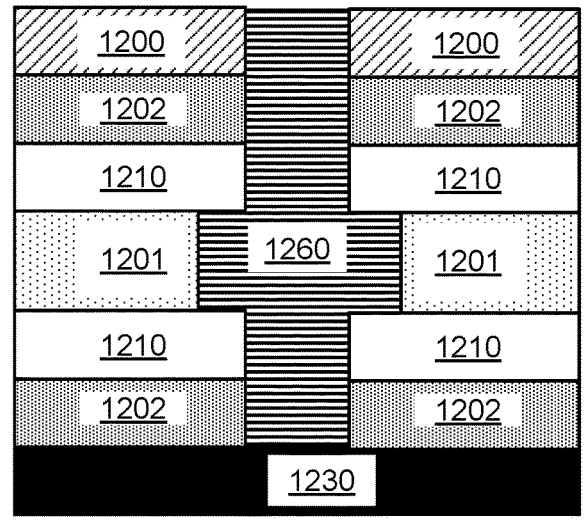

In FIG. 12F, a substrate is provided having silicon oxide 1201 with doped polysilicon 1210 directly above and below the silicon oxide 1201, as well as oxygen-doped silicon carbide 1200, and sacrificial silicon nitride layer 1202 with an etch stop layer 1230 below the lower sacrificial silicon nitride layer 1202. In FIG. 12F, a trench 1250 is formed. In FIG. 12H, the silicon oxide 1201 is recessed at 1240. In FIG. 12I, polysilicon 1260 is deposited to fill in the space generated from the trench 1250 and the silicon oxide 1201 recess. In FIG. 12J, doped polysilicon 1260 may be etched back to as shown. In some embodiments, the polysilicon 1260 may become a thin film transistor. In FIG. 12K, the gate 1270 is deposited into the trench. In FIG. 12L, the sacrificial silicon nitride layer 1202 is selectively removed, such as by wet etching, to yield features 1225. In FIG. 12M, tungsten 1240 is deposited into the features 1225 where the silicon nitride layer previously occupied. This avoids etching tungsten during formation of vias and during silicon oxide recess as tungsten does not deposit on sidewalls of the trench or via previously patterned due to the presence of polysilicon 1210 in the structure. While particular materials are described with respect to FIGS. 12F-12M, it will be understood that the multilayer stack in FIG. 12F may include other dielectric materials with different etch contrasts than those shown and described herein. Certain disclosed embodiments may be used to form devices other than transistors, such as capacitors or other memory cells inside the recessed area of a scheme such as depicted in FIG. 12J.

Apparatus

Figure 13:
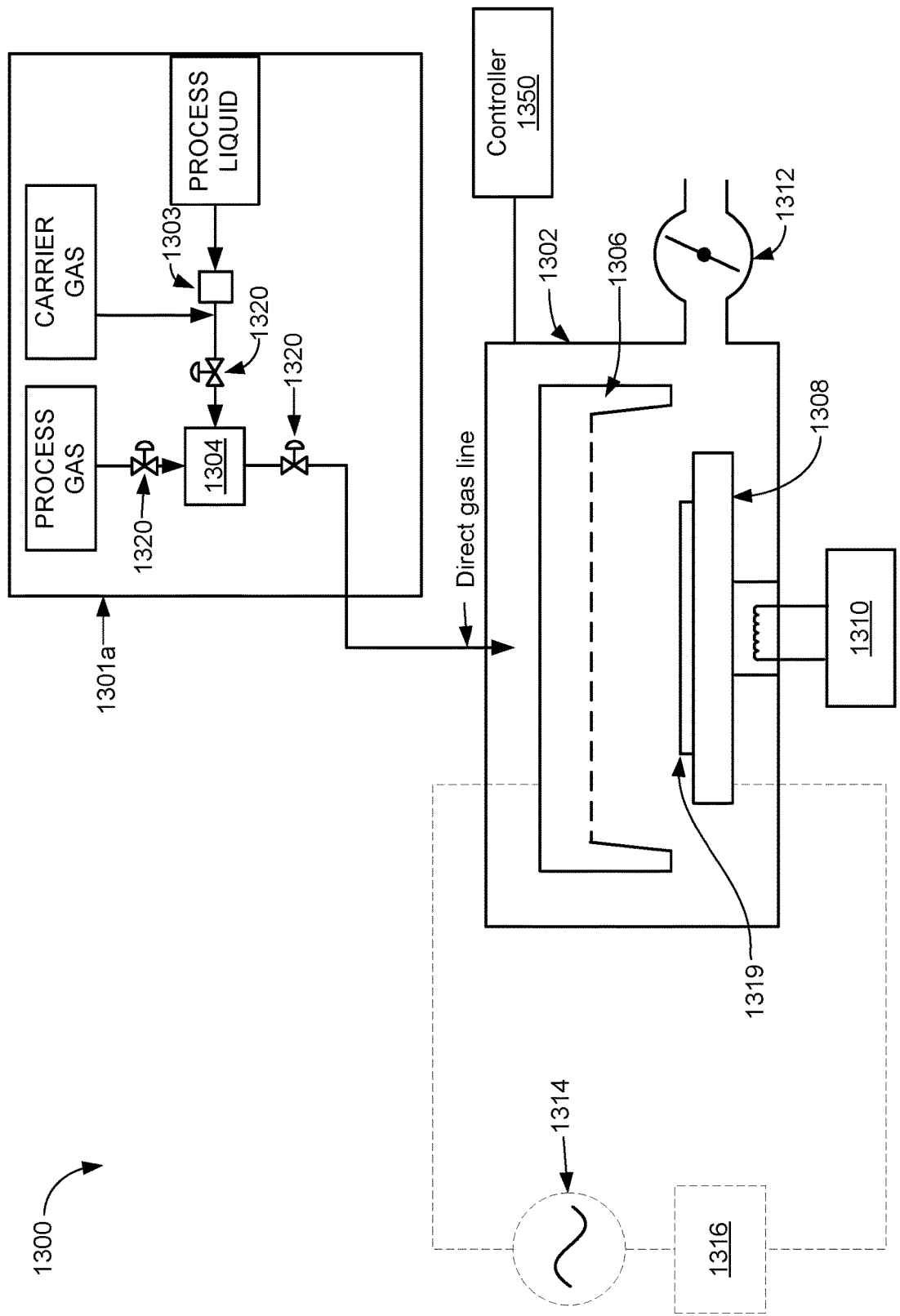
FIG. 13 depicts a block diagram showing various reactor components arranged for implementing techniques in accordance with certain disclosed embodiments.
Figure 14:
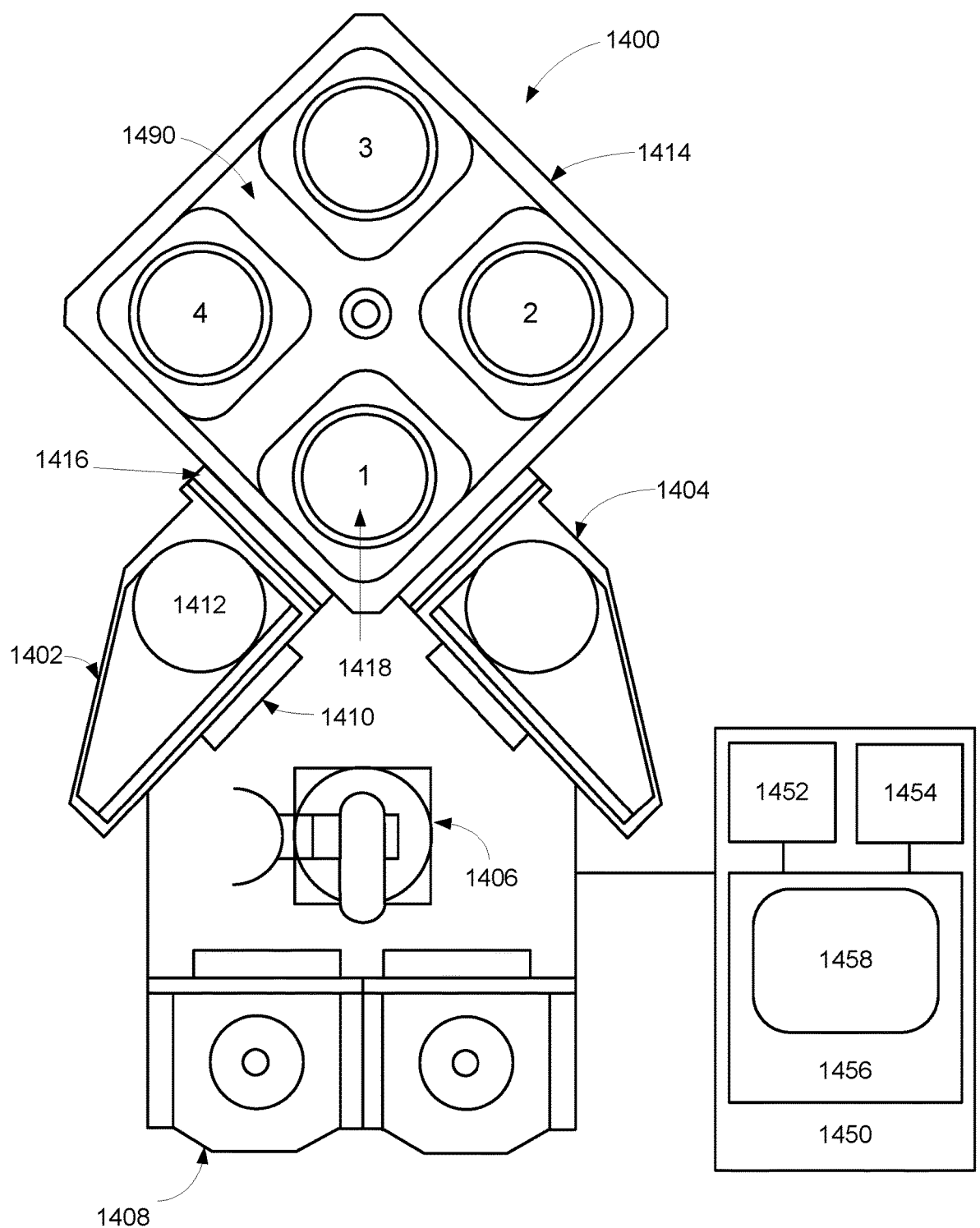
FIG. 14 depicts an embodiment of a multi-station cluster tool in accordance with disclosed embodiments.
Figure 15:
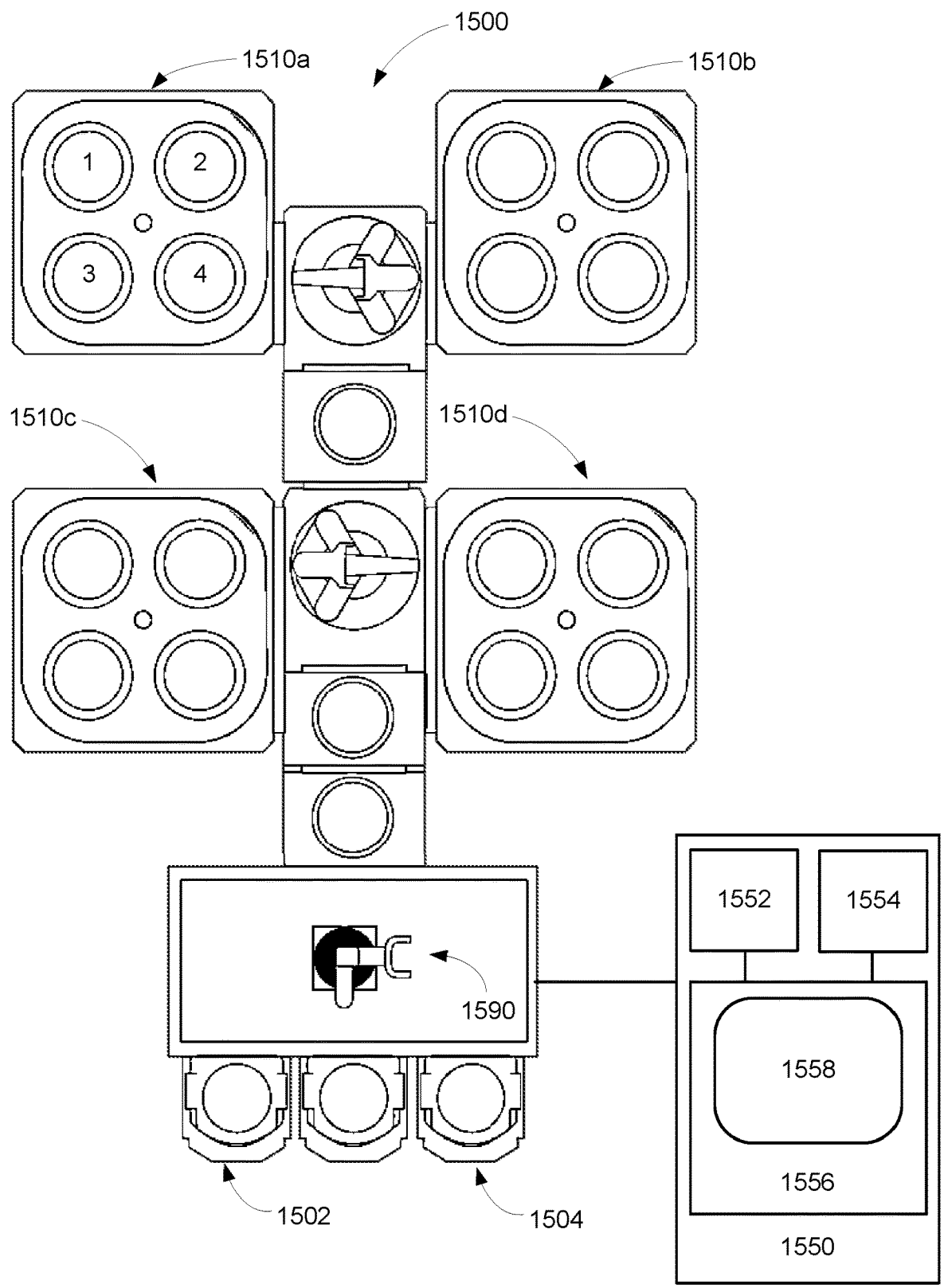
FIG. 15 schematically shows another example of a multi-station process tool according to an embodiment of the present disclosure.

FIG. 13 depicts a schematic illustration of an embodiment of an atomic layer deposition (ALD) and/or chemical vapor deposition (CVD) process station 1300 having a process chamber body 1302 for maintaining a low-pressure environment. A plurality of process stations 1300 may be included in a common low pressure process tool environment. For example, FIGS. 14 and 15 depict example embodiments of multi-station processing tools. In some embodiments, one or more hardware parameters of ALD process station 1300 including those discussed in detail below may be adjusted programmatically by one or more computer controllers 1350.

Process station 1300 fluidly communicates with reactant delivery system 1301a for delivering process gases to a distribution showerhead 1306. Reactant delivery system 1301a includes a mixing vessel 1304 for blending and/or conditioning process gases, such as a silicon precursor gas, or second reactant gas (e.g., an oxygen-containing reactant, carbon-containing reactant, etc.), for delivery to showerhead 1306. One or more mixing vessel inlet valves 1320 may control introduction of process gases to mixing vessel 1304. Plasma may also be delivered to the showerhead 1306 or may be generated in the process station 1300. Reactant delivery system 1301a may be configured to deliver process gases to a substrate provided in the process station 1300.

As an example, the embodiment of FIG. 13 includes a vaporization point 1303 for vaporizing liquid reactant to be supplied to the mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100° C. to approximately 150° C. at mixing vessel 1304.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

In some embodiments, a liquid flow controller (LFC) upstream of vaporization point 1303 may be provided for controlling a mass flow of liquid for vaporization and delivery to process station 1300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1306 distributes process gases toward substrate 1319. In the embodiment shown in FIG. 13, the substrate 1319 is located beneath showerhead 1306 and is shown resting on a pedestal 1308. Showerhead 1306 may have any suitable shape, and may have any suitable number and arrangement of ports for distributing process gases to substrate 1319.

In some embodiments, pedestal 1308 may be raised or lowered to expose substrate 1319 to a volume between the substrate 1319 and the showerhead 1306. It will be appreciated that, in some embodiments, pedestal height may be adjusted programmatically by a suitable computer controller 1350.

In another scenario, adjusting a height of pedestal 1308 may allow a plasma density to be varied during plasma activation cycles in the process in embodiments where a plasma is ignited. At the conclusion of the process phase, pedestal 1308 may be lowered during another substrate transfer phase to allow removal of substrate 1319 from pedestal 1308.

In some embodiments, pedestal 1308 may be temperature controlled via heater 1310. In some embodiments, the pedestal 1308 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 1300 may be provided by butterfly valve 1312. As shown in the embodiment of FIG. 13, butterfly valve 1312 throttles a vacuum provided by a downstream vacuum pump (not shown). However, in some embodiments, pressure control of process station 1300 may also be adjusted by varying a flow rate of one or more gases introduced to the process station 1300.

In some embodiments, a position of showerhead 1306 may be adjusted relative to pedestal 1308 to vary a volume between the substrate 1319 and the showerhead 1306. Further, it will be appreciated that a vertical position of pedestal 1308 and/or showerhead 1306 may be varied by any suitable mechanism within the scope of the present disclosure. In some embodiments, pedestal 1308 may include a rotational axis for rotating an orientation of substrate 1319. It will be appreciated that, in some embodiments, one or more of these example adjustments may be performed programmatically by one or more suitable computer controllers 1350.

In some embodiments where plasma may be used as discussed above, showerhead 1306 and pedestal 1308 electrically communicate with a radio frequency (RF) power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a particular composition of radical species. Examples of suitable powers are included above. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 180 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments.

As described above, one or more process stations may be included in a multi-station processing tool. FIG. 14 shows a schematic view of an embodiment of a multi-station processing tool 1400 with an inbound load lock 1402 and an outbound load lock 1404, either or both of which may include a remote plasma source. A robot 1406 at atmospheric pressure is configured to move wafers from a cassette loaded through a pod 1408 into inbound load lock 1402 via an atmospheric port 1410. A wafer is placed by the robot 1406 on a pedestal 1412 in the inbound load lock 1402, the atmospheric port 1410 is closed, and the load lock is pumped down. Where the inbound load lock 1402 includes a remote plasma source, the wafer may be exposed to a remote plasma treatment in the load lock prior to being introduced into a processing chamber 1414. Further, the wafer also may be heated in the inbound load lock 1402 as well, for example, to remove moisture and adsorbed gases. Next, a chamber transport port 1416 to processing chamber 1414 is opened, and another robot (not shown) places the wafer into the reactor on a pedestal of a first station shown in the reactor for processing. While the embodiment depicted in FIG. 14 includes load locks, it will be appreciated that, in some embodiments, direct entry of a wafer into a process station may be provided.

The depicted processing chamber 1414 includes four process stations, numbered from 1 to 4 in the embodiment shown in FIG. 14. Each station has a heated pedestal (shown at 1418 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 1414 may include one or more matched pairs of ALD and plasma-enhanced ALD process stations. While the depicted processing chamber 1414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 14 depicts an embodiment of a wafer handling system 1490 for transferring wafers within processing chamber 1414. In some embodiments, wafer handling system 1490 may transfer wafers between various process stations and/or between a process station and a load lock. It will be appreciated that any suitable wafer handling system may be employed. Non-limiting examples include wafer carousels and wafer handling robots.

It will be appreciated that, in some embodiments, a low-pressure transfer chamber may be included in a multi-station processing tool to facilitate transfer between a plurality of processing chambers. For example, FIG. 14 schematically shows another embodiment of a multi-station processing tool 1500. In the embodiment shown in FIG. 14, multi-station processing tool 1400 includes a plurality of processing chambers 1414 including a plurality of process stations (numbered 1 through 4). Processing chambers 1414 are interfaced with a low-pressure transport chamber 1404 including a robot 1406 configured to transport substrates between processing chambers 1414 and load lock 1419. An atmospheric substrate transfer module 1410, including an atmospheric robot 1412, is configured to facilitate transfer of substrates between load lock 1419 and pod 1408.

FIG. 14 also depicts an embodiment of a system controller 1450 employed to control process conditions and hardware states of process tool 1400. System controller 1450 may include one or more memory devices 1456, one or more mass storage devices 1454, and one or more processors 1452. Processor 1452 may include a CPU or computer, analog, and/or digital input/output connections, stepper motor controller boards, etc.

In some embodiments, system controller 1450 controls all of the activities of process tool 1400. System controller 1450 executes system control software 1458 stored in mass storage device 1454, loaded into memory device 1456, and executed on processor 1452. Alternatively, the control logic may be hard coded in the controller 1450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1400. System control software 1458 may be configured in any suitable way. For example, various process tool component subroutines or control objects may be written to control operation of the process tool components used to carry out various process tool processes. System control software 1458 may be coded in any suitable computer readable programming language.

In some embodiments, system control software 1458 may include input/output control (IOC) sequencing instructions for controlling the various parameters described above. Other computer software and/or programs stored on mass storage device 1454 and/or memory device 1456 associated with system controller 1450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1418 and to control the spacing between the substrate and other parts of process tool 1400.

A process gas control program may include code for controlling gas composition (e.g., silicon precursor gases, and carbon-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1450. The user interface may include a display screen, graphical software displays of the apparatus and/or process conditions, and user input devices such as pointing devices, keyboards, touch screens, microphones, etc.

In some embodiments, parameters adjusted by system controller 1450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1450 from various process tool sensors. The signals for controlling the process may be output on the analog and digital output connections of process tool 1400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 1450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1450.

In some implementations, the system controller 1450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1450, in some implementations, may be a part of or coupled to a computer that is integrated with, coupled to the system, otherwise networked to the system, or a combination thereof. For example, the system controller 1450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1450 receives instructions in the form of data, which specify parameters for each of the processing steps to be performed during one or more operations. It should be understood that the parameters may be specific to the type of process to be performed and the type of tool that the system controller 1450 is configured to interface with or control. Thus as described above, the system controller 1450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

FIG. 15 shows a schematic view of an embodiment of a multi-station processing tool 1500 with an inbound load lock 1502 and an outbound load lock 1504, either or both of which may include a remote plasma source. One example of a commercial embodiment of a suitable tool is a Strata tool available from Lam Research Corp. of Fremont, CA The depicted processing tool 1500 includes four processing chambers 1510*a*, 1510*b*, 1510*c*, and 1510*d*. Each processing chamber includes four processing stations, which are labeled 1, 2, 3, and 4 in processing chamber 1510*a*. Each station has a heated pedestal (shown at processing chamber 1510*a* for processing station 1), and gas line inlets. It will be appreciated that in some embodiments, each process station may have different or multiple purposes. For example, in some embodiments, a processing station may be switchable between an PECVD, ALD, and plasma-enhanced ALD process mode. Additionally or alternatively, in some embodiments, processing chamber 1510*a* may include one or more matched pairs of PECVD, ALD and plasma-enhanced ALD process stations. While the depicted processing chamber 1510*b* includes four stations 1, 2, 3, and 4, it will be understood that a processing chamber according to the present disclosure may have any suitable number of stations. Each station within each processing chamber may be used to process four different materials, such that one material is deposited in each station. In some embodiments, each station can be used to deposit four different materials. In some embodiments, single station processing chambers may be used. In some embodiments, 4-station processing chambers may be used.

Additionally, processing tool 1500 shows four processing chambers but it will be understood that a processing tool may include more than four or less than four processing chambers, each having one or more processing stations. For example, in some embodiments, a processing chamber may have five or more stations, while in other embodiments a processing chamber may have three or fewer stations.

FIG. 15 includes a wafer handling system 1590 for transferring wafers between processing chambers 1510*a*, 1510*b*, 1510*c*, and 1510*d* and within processing tool 1500. In some embodiments, wafer handling system 1590 may transfer wafers between various process stations and/or between a process station and a load lock. It will be appreciated that any suitable wafer handling system may be employed. Non-limiting examples include wafer carousels and wafer handling robots.

FIG. 15 also depicts an embodiment of a system controller 1550 employed to control process conditions and hardware states of process tool 1500. System controller 1550 may include one or more memory devices 1556, one or more mass storage devices 1554, and one or more processors 1552. Processor 1552 may include a CPU or computer, analog, and/or digital input/output connections, stepper motor controller boards, etc.

In some embodiments, system controller 1550 controls all of the activities of process tool 1500. System controller 1550 executes system control software 1558 stored in mass storage device 1554, loaded into memory device 1556, and executed on processor 1552. Alternatively, the control logic may be hard coded in the controller 1550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1500. System control software 1558 may be configured in any suitable way. For example, various process tool component subroutines or control objects may be written to control operation of the process tool components used to carry out various process tool processes. System control software 1558 may be coded in any suitable computer readable programming language.

The controller 1550 may have any of the features described above with respect to controller 1450.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

An experiment was conducted to etch high aspect ratio trenches in a multi-layer stack having sets of metal-free layers between two silicon oxide layers, an ashable hard mask layer over the top silicon oxide layer. The sets of metal-free layers included silicon-containing layers. The metal-free layers did not include any tungsten. There were between 4-12 sets of metal-free layers in the substrate. The high aspect ratio features were etched and the resulting feature exhibited no line collapse and a smooth profile.

A second experiment was conducted to recess sidewalls of silicon oxide material in a patterned multi-layer stack having sets of metal-free layers. Each set of metal-free layers included at least one layer of silicon oxide. Since the multi-layer stack is patterned, pillars of the multi-layer stack were etched simultaneously such that sidewalls of silicon oxide layers throughout the multi-layer pillars were etched at the same time. The spaces between the pillars were negative features having aspect ratios between about 25:1 and about 35:1. An etch selectivity of at least 50:1 was achieved for silicon oxide relative to other silicon-containing metal-free layers on the substrate. Etching was performed using 100:1 dilute HF. High isotropic etch selectivity was achieved for silicon oxide material relative to silicon nitride, polysilicon, and silicon oxycarbide materials.

CONCLUSION

Ranges described herein are inclusive of their endpoints. Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a semiconductor substrate;
   depositing a metal-free multi-layer stack having at least three different materials, at least one of the three different materials being a sacrificial layer;
   etching a trench or via in the metal-free multi-layer stack having the at least three different materials;
   recessing one of the at least three different materials after etching the trench or via to form a recessed region of the via;
   depositing a dielectric or semiconductor material into the trench or via;
   etching back the dielectric or semiconductor material in the trench or via to form smooth sidewalls, leaving the dielectric or semiconductor material in the recessed region; and
   prior to selectively etching the sacrificial layer, depositing a gate material into the trench or via, and recessing a dielectric material in sidewalls of the trench or via in the metal-free multi-layer stack;
   selectively etching the sacrificial layer relative to other materials of the metal-free multi-layer stack to form at least one space between layers of the metal-free multi-layer stack; and
   depositing metal in the at least one space to form a metal-containing multi-layer stack having a trench or via etched therein.

2. The method of claim 1, wherein the metal-free multi-layer stack includes three different materials.

3. The method of claim 1, wherein the metal-free multi-layer stack includes four different materials.

4. The method of claim 1, wherein the sacrificial layer is selected from the group consisting of polysilicon and silicon nitride.

5. The method of claim 1, wherein the at least three different materials comprise materials selected from the group consisting of silicon oxide, undoped polysilicon, doped polysilicon, silicon nitride, oxygen-doped silicon carbide, and nitrogen-doped silicon carbide.

6. The method of claim 1, wherein layers of the metal-free multi-layer stack are deposited by a technique selected from the group consisting of atomic layer deposition, chemical vapor deposition, plasma-enhanced chemical vapor deposition, and physical vapor deposition.

7. The method of claim 1, wherein layers of the metal-free multi-layer stack are deposited in different chambers of a single tool.

8. The method of claim 1, wherein layers of the metal-free multi-layer stack are deposited without breaking vacuum.

* * * * *